US012689334B2

(12) United States Patent
    Honda

(10) Patent No.:  US 12,689,334 B2
(45) Date of Patent:       Jul. 21, 2026

(54) POWER AMPLIFIER CIRCUIT

(71) Applicant: Murata Manufacturing Co., Ltd.,
                Kyoto (JP)

(72) Inventor:  Yuri Honda, Kyoto (JP)

(73) Assignee: Murata Manufacturing Co., Ltd.,
               Kyoto (JP)

( * ) Notice:   Subject to any disclaimer, the term of this
                patent is extended or adjusted under 35
                U.S.C. 154(b) by 553 days.

(21) Appl. No.: 18/192,835

(22) Filed:     Mar. 30, 2023

(65)            Prior Publication Data

US 2023/0318538 A1      Oct. 5, 2023

(30)        Foreign Application Priority Data

Mar. 31, 2022    (JP) ................................. 2022-060093

(51) Int. Cl.
    *H03F 1/52*        (2006.01)
    *H03F 3/21*        (2006.01)
(52) U.S. Cl.
    CPC ............. *H03F 1/523* (2013.01); *H03F 3/211*
        (2013.01); *H03F 2200/06* (2013.01); *H03F*
        *2200/09* (2013.01); *H03F 2200/426* (2013.01);
                          *H03F 2200/441* (2013.01)
(58) Field of Classification Search
    CPC ...... H03F 3/211; H03F 1/0222; H03F 1/0288;
             H03F 2200/451; H04B 1/0458; H04B
                                         2001/045
    USPC ........................................................ 333/205
    See application file for complete search history.

(56)                References Cited

U.S. PATENT DOCUMENTS 3,796,967 A  *   3/1974  Sondermeyer ............ H03F 1/52
                                                          330/293
    10,992,266 B2 *   4/2021  Ding ......................... H03F 1/22
    12,375,046 B2 *   7/2025  Datta ................... H04B 1/0458
  2014/0043715 A1 *   2/2014  Cosgrave .................. H03F 1/52
                                                          361/90
  2014/0118068 A1     5/2014  Kawasaki et al.
  2019/0356288 A1 *  11/2019  Tsutsui .................. H03F 1/0261
  2021/0226589 A1 *   7/2021  Han ........................ H03F 1/302
  2023/0079623 A1 *   3/2023  Gebeyehu ............. H03F 1/0261
                                                          455/127.1

FOREIGN PATENT DOCUMENTS

CN          110690859 A      1/2020
    CN          114094957 A      2/2022
    JP          2014-90299 A     5/2014

* cited by examiner

*Primary Examiner* — Hafizur Rahman
    (74) *Attorney, Agent, or Firm* — McDonald Hopkins LLC

(57)                ABSTRACT

A power amplifier circuit includes a first amplifier that
operates in accordance with a first voltage supplied from a
voltage supply source, amplifies a first signal, and outputs an
amplification signal, a bias transistor that includes a base or
a gate to which a bias control current is supplied and an
emitter or a source supplying a bias to the first amplifier
through a first resistor element, and a protection circuit that
causes part of the bias control current to flow to a ground on
the basis of the amplification signal and a second signal
based on the first voltage.

17 Claims, 13 Drawing Sheets

POWER AMPLIFIER CIRCUIT

CROSS REFERENCE TO RELATED APPLICATION

This application claims priority from Japanese Patent Application No. 2022-060093 filed on Mar. 31, 2022. The content of this application is incorporated herein by reference in its entirety.

BACKGROUND ART

The present disclosure relates to a power amplifier circuit.

As devices with a configuration including a driver amplifier and a power amplifier, wireless devices that control the bias of a driver amplifier in accordance with the voltage of a signal output from the driver amplifier have been known (see, for example, Japanese Unexamined Patent Application Publication No. 2014-90299).

BRIEF SUMMARY

In a wireless device described in Japanese Unexamined Patent Application Publication No. 2014-90299, a determination is made as to whether or not there is a variation in the gain of the power amplifier on the basis of a monitor value of power input to the power amplifier from the driver amplifier or a monitor value of power output from the power amplifier. Specifically, in the case where it is determined that there is a variation in the gain of the power amplifier on the basis of the monitor value of power input to the power amplifier, the monitor value of power output from the power amplifier is output to a driver controller that controls the bias voltage of the driver amplifier so that the bias voltage of the driver amplifier is controlled. In contrast, in the case where it is determined that there is no variation in the gain of the power amplifier on the basis of the monitor value of power input to the power amplifier, a determination as to whether or not there is a variation in the gain of the power amplifier is performed on the basis of the monitor value of power output from the power amplifier. In the case where it is determined that there is a variation in the gain of the power amplifier, the bias voltage of the power amplifier is controlled.

However, for example, when the driving voltage of the driver amplifier varies, power output from the driver amplifier also varies. In the wireless device described in Japanese Unexamined Patent Application Publication No. 2014-90299, if the power output from the driver amplifier becomes too high, breakage of the driver amplifier or the power amplifier may occur.

The present disclosure provides a power amplifier circuit that is capable of suppressing breakage of an amplifier.

A power amplifier circuit according to an aspect of the present disclosure includes a first amplifier that operates in accordance with a first voltage supplied from a voltage supply source, amplifies a first signal, and outputs an amplification signal; a bias transistor that includes a base or a gate to which a bias control current is supplied and an emitter or a source supplying a bias to the first amplifier through a first resistor element; and a protection circuit that causes part of the bias control current to flow to a ground on the basis of the amplification signal and a second signal based on the first voltage.

A power amplifier circuit according to another aspect of the present disclosure includes a first amplifier that supplies power to a load; a bias transistor that includes a base or a gate to which a bias control current is supplied and an emitter or a source supplying a bias to the first amplifier through a first resistor element; and a protection circuit that causes part of the bias control current to flow to a ground on the basis of a third signal based on a change in the load.

According to the present disclosure, a power amplifier circuit that is capable of suppressing breakage of an amplifier can be provided.

DETAILED DESCRIPTION

Hereinafter, embodiments of the present disclosure will be described in detail with reference to drawings. The same signs will be assigned to the same elements, and redundant explanation will be omitted as much as possible.

First Embodiment

Figure 1:
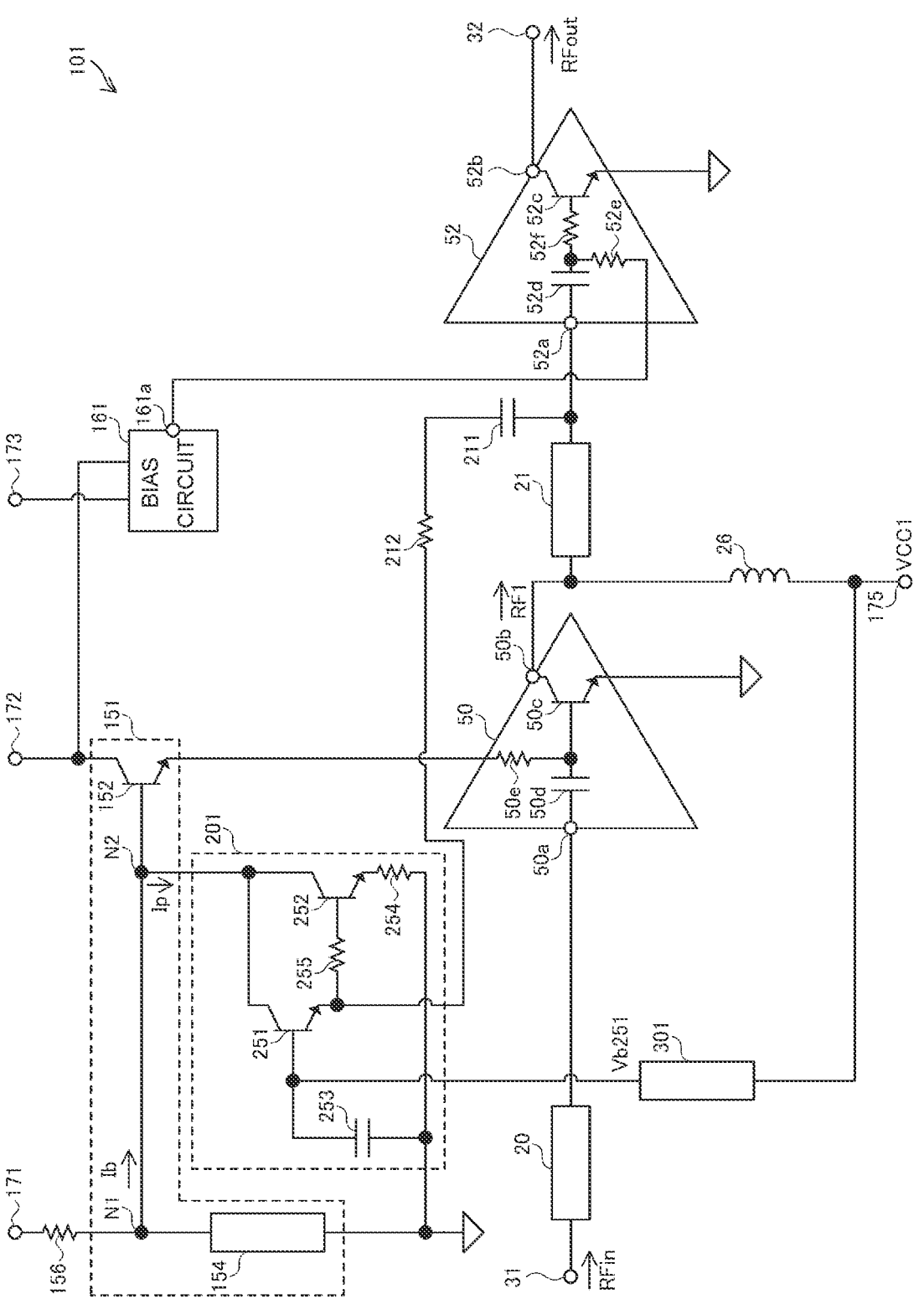
FIG. 1 is a circuit diagram of a power amplifier circuit 101.

A power amplifier circuit 101 according to a first embodiment will be described. FIG. 1 is a circuit diagram of the power amplifier circuit 101. As illustrated in FIG. 1, the power amplifier circuit 101 is a two-stage amplifier circuit that amplifies an input signal RFin (first signal) supplied to an input terminal 31 and outputs an output signal RFout from an output terminal 32. The input signal RFin is, for example, a radio frequency (RF) signal. A load (not illustrated in FIG. 1) such as an antenna is connected in a stage subsequent to the output terminal 32.

The power amplifier circuit 101 includes an input matching circuit 20, an interstage matching circuit 21, an inductor 26, a driver-stage amplifier 50, a power-stage amplifier 52, a driver-stage bias supply circuit 151, a resistor element 156, a power-stage bias supply circuit 161, a protection circuit 201, a capacitor 211 (second capacitor), a resistor element 212, and a voltage level shift circuit 301 (voltage shift circuit).

The driver-stage amplifier 50 includes an input terminal 50a, an output terminal 50b, an amplifier transistor 50c (first amplifier), a capacitor 50d, and a resistor element 50e (first resistor element). The power-stage amplifier 52 includes an input terminal 52a, an output terminal 52b, an amplifier transistor 52c (second amplifier), a capacitor 52d, and resistor elements 52e and 52f. The driver-stage bias supply circuit 151 includes a bias transistor 152 and a reference voltage generation circuit 154. The protection circuit 201 includes a transistor 251 (first transistor), a transistor 252 (second transistor), a capacitor 253 (first capacitor), and resistor elements 254 and 255.

In this embodiment, transistors, such as the amplifier transistors 50c and 52c, the bias transistor 152, and the transistors 251 and 252 are, for example, bipolar transistors such as heterojunction bipolar transistors (HBTs). These transistors may be other types of transistors such as metal-oxide-semiconductor field-effect transistors (MOSFETs). In such a case, a base, a collector, and an emitter may be replaced with a gate, a drain, and a source, respectively.

The driver-stage amplifier 50 amplifies the input signal RFin supplied to the input terminal 50a from the input terminal 31 through the input matching circuit 20 and outputs an amplification signal RF1 from the output terminal 50b.

More particularly, a power supply voltage supply terminal 175 (voltage supply source and low-impedance node) supplies a power supply voltage VCC1 (first voltage) for operating the amplifier transistor 50c in the driver-stage amplifier 50. The output terminal 50b is connected to the power supply voltage supply terminal 175 with the inductor 26 interposed therebetween. For example, in the case where envelope tracking control is performed in the power amplifier circuit 101, the power supply voltage VCC1 varies.

The amplifier transistor 50c includes a collector connected to the output terminal 50b, a base connected to the input terminal 50a with the capacitor 50d interposed therebetween, and an emitter connected to the ground.

The driver-stage bias supply circuit 151 supplies a bias to the base of the amplifier transistor 50c through the resistor element 50e. More particularly, the driver-stage bias supply circuit 151 includes the bias transistor 152 and the reference voltage generation circuit 154.

The bias transistor 152 includes a collector connected to a battery voltage supply terminal 172, a base connected to a node N2, and an emitter connected to the base of the amplifier transistor 50c with the resistor element 50e interposed therebetween.

The resistor element 156 includes a first end connected to a current supply terminal 171 and a second end connected to a node N1. The reference voltage generation circuit 154 includes a first end connected to the node N2 with the node N1 interposed therebetween and a second end connected to the ground. The reference voltage generation circuit 154 includes, for example, a plurality of diodes that are connected in series. When a current supplied from the current supply terminal 171 flows to the plurality of diodes, a reference voltage that is substantially constant with respect to the ground is generated at the node N1. This reference voltage turns on the bias transistor 152, and a bias control current Ib flows from the node N1 toward the base of the bias transistor 152 and the protection circuit 201.

The interstage matching circuit 21 includes a first end connected to the output terminal 50b of the driver-stage amplifier 50 and a second end connected to the input terminal 52a of the power-stage amplifier 52. The interstage matching circuit 21 matches the impedance between the driver-stage amplifier 50 and the power-stage amplifier 52.

The power-stage bias supply circuit 161 operates in accordance with a voltage supplied from the battery voltage supply terminal 172. The power-stage bias supply circuit 161 is controlled in accordance with a control current input from a control signal supply terminal 173 (control current source). The power-stage bias supply circuit 161 generates a bias voltage to be supplied to the power-stage amplifier 52 and outputs the generated bias voltage from an output terminal 161a.

The power-stage amplifier 52 amplifies the amplification signal RF1 supplied to the input terminal 52a from the second end of the interstage matching circuit 21, and outputs the output signal RFout from the output terminal 52b.

More particularly, the capacitor 52d of the power-stage amplifier 52 includes a first end connected to the second end of the interstage matching circuit 21 with the input terminal 52a interposed therebetween, and a second end.

The amplifier transistor 52c includes a collector connected to the output terminal 32 with the output terminal 52b interposed therebetween, a base connected to the second end of the capacitor 52d with the resistor element 52f interposed therebetween, and an emitter connected to the ground.

The resistor element 52e includes a first end connected to the output terminal 161a of the power-stage bias supply circuit 161 and a second end connected to the second end of the capacitor 52d.

The voltage level shift circuit 301 is connected between the power supply voltage supply terminal 175 and the base of the transistor 251 in the protection circuit 201. The voltage level shift circuit 301 shifts the power supply voltage VCC1 supplied from the power supply voltage supply terminal 175 and supplies the shifted power supply voltage VCC1 to the base of the transistor 251.

Figure 2:
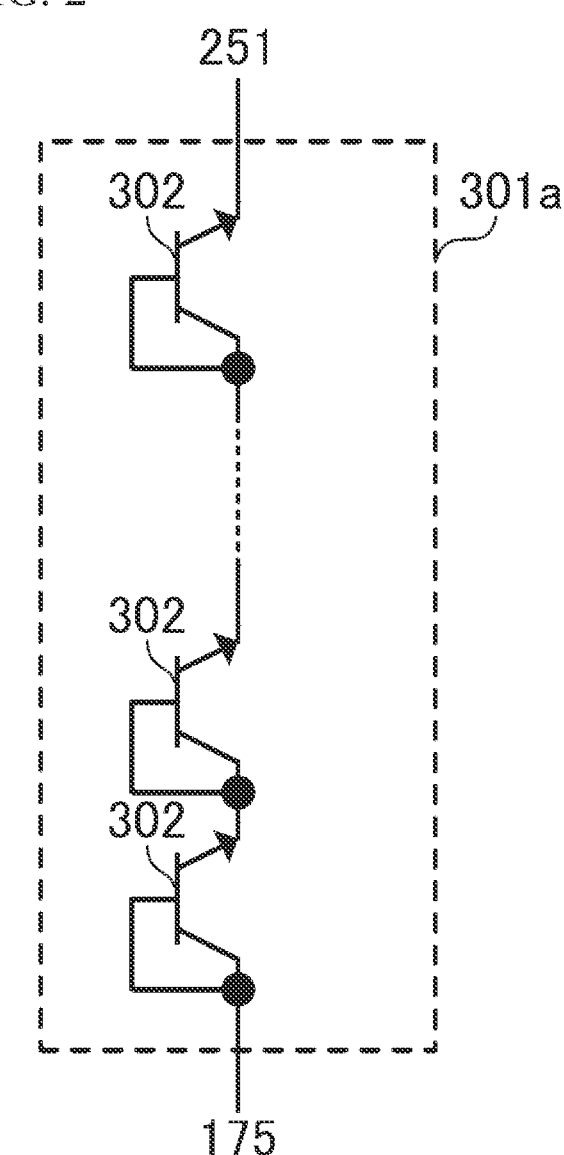
FIG. 2 is a circuit diagram of a voltage level shift circuit 301a, which is an example of a voltage level shift circuit 301.

FIG. 2 is a circuit diagram of a voltage level shift circuit 301a, which is an example of the voltage level shift circuit 301. As illustrated in FIG. 2, the voltage level shift circuit 301a includes N (N represents an integer of 1 or more) transistors 302 (first diodes).

In the case where N represents 1, the transistor 302 includes a collector connected to the power supply voltage supply terminal 175, a base connected to the collector, and an emitter connected to the base of the transistor 251. In this case, a voltage obtained by subtracting the voltage Vbes between the base and emitter of the transistor 302 (or ON voltage) from the power supply voltage VCC1 is supplied as a base voltage Vb251, which will be described later, to the base of the transistor 251. Hereinafter, connection between the collector and the base of a transistor may be referred to as first diode connection.

In the case where N represents 2 or more, the N transistors 302 that are in the first diode connection state are connected in series in such a manner that the emitters of the transistors 302 are arranged close to the base of the transistor 251. In this case, a voltage obtained by subtracting the product of the voltage Vbes and N from the power supply voltage VCC1 is supplied as the base voltage Vb251, which will be described later, to the base of the transistor 251.

Figure 3:
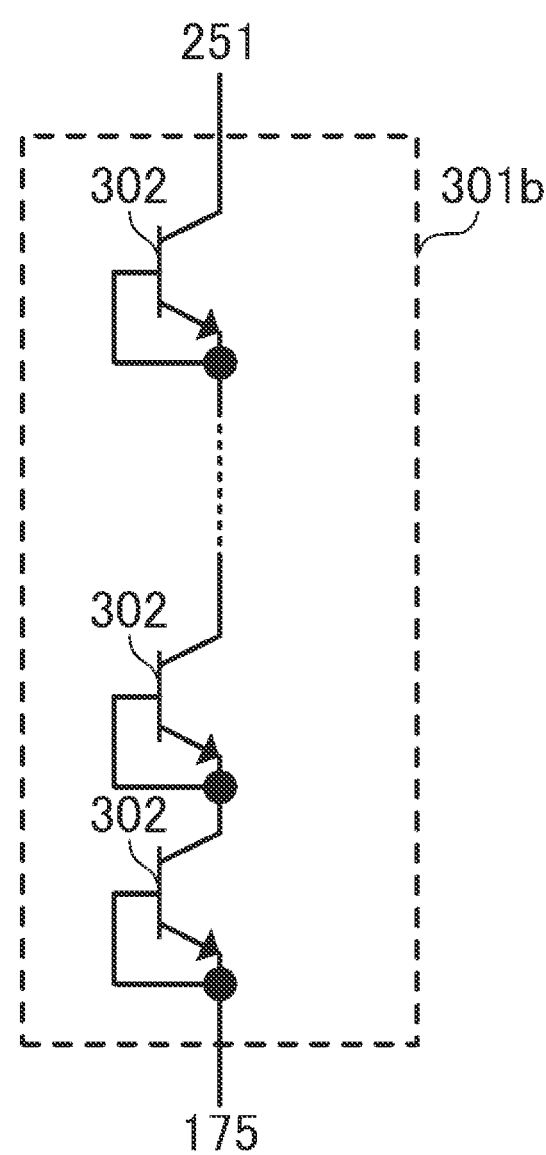
FIG. 3 is a circuit diagram of a voltage level shift circuit 301b, which is an example of the voltage level shift circuit 301.

FIG. 3 is a circuit diagram of a voltage level shift circuit 301b, which is an example of the voltage level shift circuit 301. As illustrated in FIG. 3, the voltage level shift circuit 301b includes N transistors 302.

In the case where N represents 1, the transistor 302 includes a collector connected to the base of the transistor 251, a base, and an emitter connected to the base and the power supply voltage supply terminal 175. In this case, a voltage obtained by subtracting a voltage Vcb between the collector and the base of the transistor 302 from the power supply voltage VCC1 is supplied as the base voltage Vb251, which will be described later, to the base of the transistor 251. Hereinafter, connection between the emitter and the base of a transistor may be referred to as second diode connection.

In the case where N represents 2 or more, the N transistors 302 that are in the second diode connection state are connected in series in such a manner that the collectors of the transistors 302 are arranged close to the base of the transistor 251. In this case, a voltage obtained by subtracting the product of the voltage Vcb and N from the power supply voltage VCC1 is supplied as the base voltage Vb251, which will be described later, to the base of the transistor 251.

Figure 4:
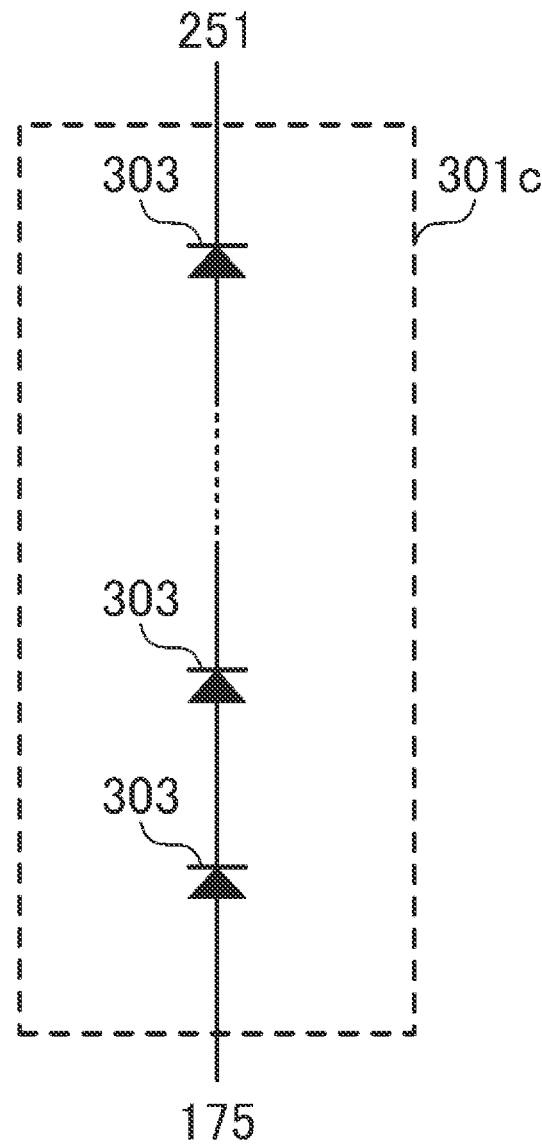
FIG. 4 is a circuit diagram of a voltage level shift circuit 301c, which is an example of the voltage level shift circuit 301.

FIG. 4 is a circuit diagram of a voltage level shift circuit 301c, which is an example of the voltage level shift circuit 301. As illustrated in FIG. 4, the voltage level shift circuit 301c includes N diodes 303 (first diodes).

In the case where N represents 1, the diode 303 includes a cathode connected to the base of the transistor 251 and an anode connected to the power supply voltage supply terminal 175. In this case, a voltage obtained by subtracting the forward voltage of the diode 303 from the power supply voltage VCC1 is supplied as the base voltage Vb251, which will be described later, to the base of the transistor 251.

In the case where N represents 2 or more, the N diodes 303 are connected in series in such a manner that the cathodes of the diodes 303 are arranged close to the base of the transistor 251. In this case, a voltage obtained by subtracting the product of the forward voltage and N from the power supply voltage VCC1 is supplied as the base voltage Vb251, which will be described later, to the base of the transistor 251. Hereinafter, a voltage shifted by the voltage level shift circuit 301 may be referred to as a shift voltage Vsft.

As illustrated in FIG. 1, the protection circuit 201 causes part of the bias control current Ib to flow to the ground in accordance with the amplification signal RF1 and a second signal based on the power supply voltage VCC1. Specifically, the second signal is the base voltage Vb251, which is supplied to the base of the transistor 251. In the case where the base voltage Vb251 is higher than 2Vbe, which is a voltage that is twice the voltage Vbe between the base and the emitter of the transistor 251 (or ON voltage) or a voltage that turns on both the transistors 251 and 252, when the amplitude of the amplification signal RF1 becomes larger than a predetermined value, the protection circuit 201 protects the driver-stage amplifier 50 and the power-stage amplifier 52 by causing part of the bias control current Ib to flow as a protection current Ip to the ground.

More particularly, the transistor 251 in the protection circuit 201 includes a collector connected to the node N2, a base connected to the second end of the voltage level shift circuit 301, and an emitter.

The resistor element 212 includes a first end connected to the emitter of the transistor 251, and a second end. The capacitor 211 includes a first end connected to the second end of the resistor element 212 and a second end connected to the input terminal 52a of the power-stage amplifier 52. The capacitor 211 is provided to block direct current.

The capacitor 253 includes a first end connected to the base of the transistor 251 and a second end connected to the ground.

The transistor 252 includes a collector connected to the node N2, a base connected to the emitter of the transistor 251 with the resistor element 255 interposed therebetween, and an emitter connected to the ground with the resistor element 254 interposed therebetween.

An operation of the protection circuit 201 will be described below. Desirably, the protection circuit 201 does not operate during a normal operation time. For example, by setting 2Vbe+Vsft to be higher than the upper limit voltage of the power supply voltage VCC1 for a normal operation, where Vbe represents the ON voltage of the transistors 251 and 252 (specifically, the voltage between the base and the emitter of each of the transistors 251 and 252), the power supply voltage VCC1 during a normal operation is equal to or lower than 2Vbe+Vsft. Thus, the transistors 251 and 252 during a normal operation can be maintained at the OFF state, and this state causes the protection circuit 201 not to operate. In this case, since the protection circuit 201 does not cause the protection current Ip to flow from the node N2 to the ground, the bias control current Ib is maintained, and the driver-stage amplifier 50 thus operates normally.

In the power amplifier circuit 101, when VCC1 becomes higher than 2Vbe+Vsft, the transistors 251 and 252 are transitioned from ON state to OFF state, so that the protection circuit 201 enters the operating state.

Figure 5:
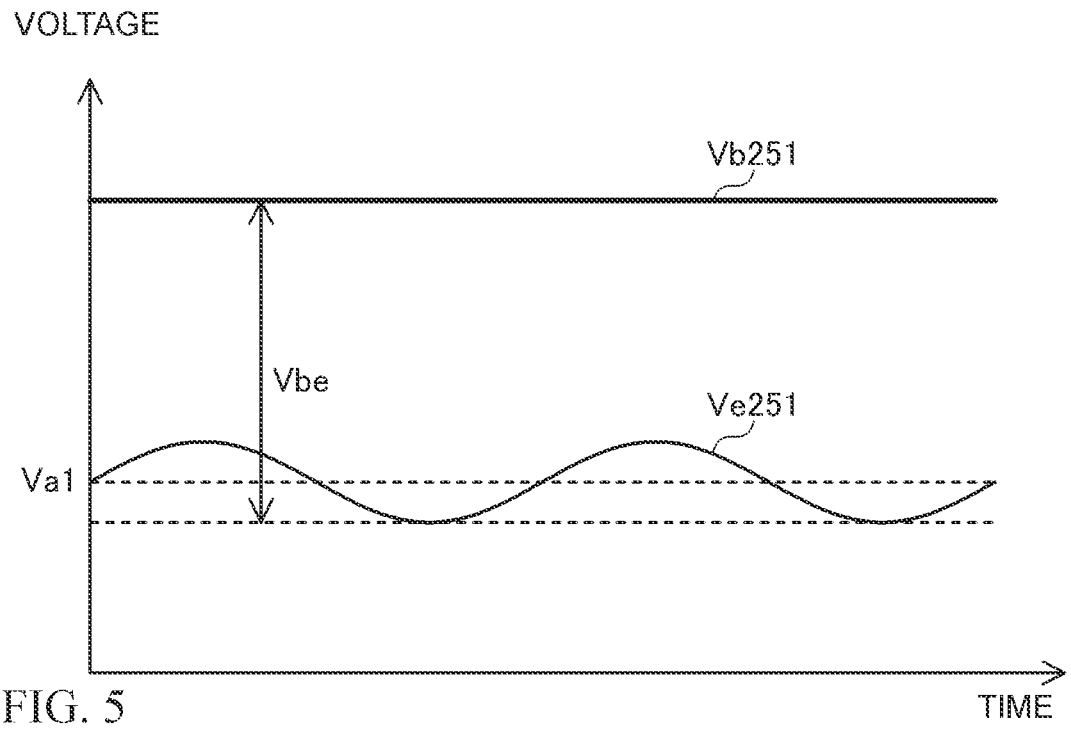
FIG. 5 is a diagram illustrating an example of changes of a base voltage Vb251 and an emitter voltage Ve251 of a transistor 251 with time in the case where the RF amplitude of an amplification signal RF1 is small.

FIG. 5 is a diagram illustrating an example of changes of the base voltage Vb251 and the emitter voltage Ve251 of the transistor 251 with time in the case where the RF amplitude of the amplification signal RF1 is small. In FIG. 5, the horizontal axis represents time and the vertical axis represents voltage.

As illustrated in FIG. 5, since the base of the transistor 251 is grounded through the capacitor 253, the base voltage Vb251 of the transistor 251 is substantially constant without necessarily changing with time.

The RF amplitude of the amplification signal RF1 is input to the emitter of the transistor 251 through the capacitor 211 and the resistor element 212. The time average of the emitter voltage Ve251 of the transistor 251 in the case where the RF amplitude is small is an average voltage Va1.

Figure 6:
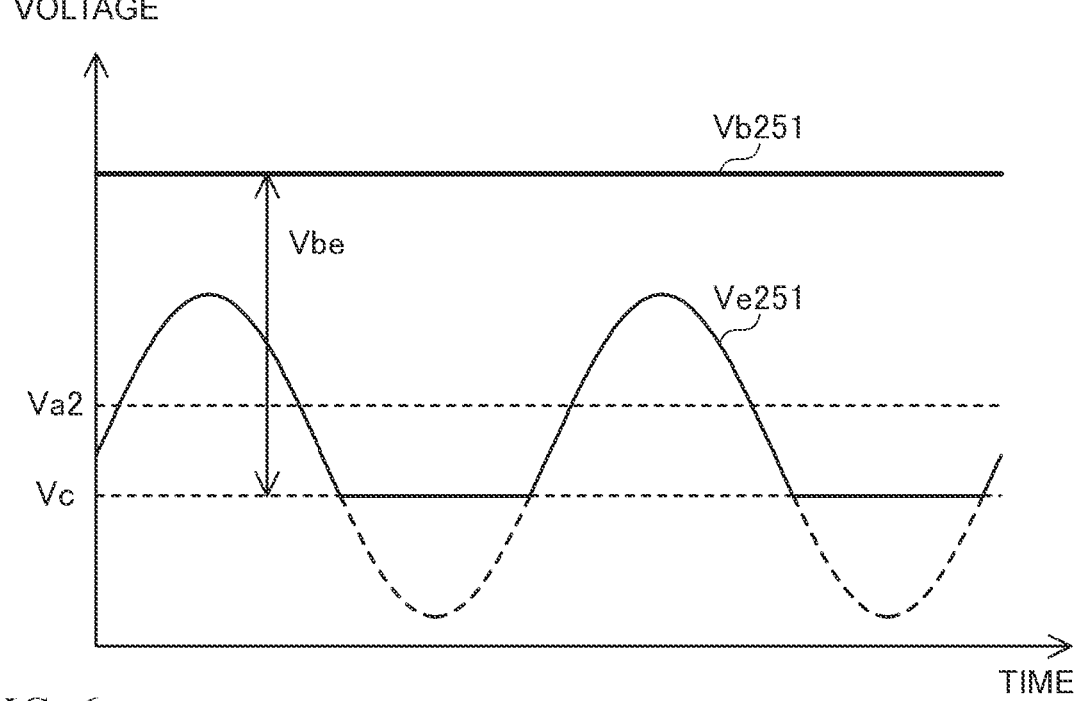
FIG. 6 is a diagram illustrating an example of changes of the base voltage Vb251 and the emitter voltage Ve251 of the transistor 251 with time in the case where the RF amplitude of the amplification signal RF1 is large.

FIG. 6 is a diagram illustrating an example of changes of the base voltage Vb251 and the emitter voltage Ve251 of the transistor 251 with time in the case where the RF amplitude of the amplification signal RF1 is large. FIG. 6 can be read in a manner similar to FIG. 5.

As illustrated in FIG. 6, the emitter voltage Ve251 of the transistor 251 does not drop below a voltage Vc that is obtained by subtracting Vbe from the base voltage Vb251.

Thus, in the case where the RF amplitude of the amplification signal RF1 is large, the waveform of a change of the emitter voltage Ve251 with time is a shape in which a voltage part lower than the voltage Vc is missing. Thus, the average voltage Va2 of the emitter voltage Ve251 in the case where the RF amplitude of the amplification signal RF1 is large is higher than the average voltage Va1 illustrated in FIG. 5.

That is, when the RF amplitude of the amplification signal RF1 increases, the base voltage of the transistor 252 increases, and the collector current of the transistor 252 thus increases. This causes part of the bias control current Ib to flow as the protection current Ip to the ground, and the level of power output from the driver-stage amplifier 50 can thus be reduced. Accordingly, when the RF amplitude of the amplification signal RF1 is large in the case where the power supply voltage VCC1 is higher than 2Vbe+Vsft, the protection circuit 201 can cause part of the bias control current Ib to flow as the protection current Ip to the ground. Thus, the possibility of breakage of the driver-stage amplifier 50 and the power-stage amplifier 52 can be reduced.

Second Embodiment

A power amplifier circuit 102 according to a second embodiment will be described. In the second and subsequent embodiments, description of features common to the first embodiment will be omitted and only different features will be described. In particular, similar operational features achieved by similar configurations will not be mentioned in individual embodiments.

Figure 7:
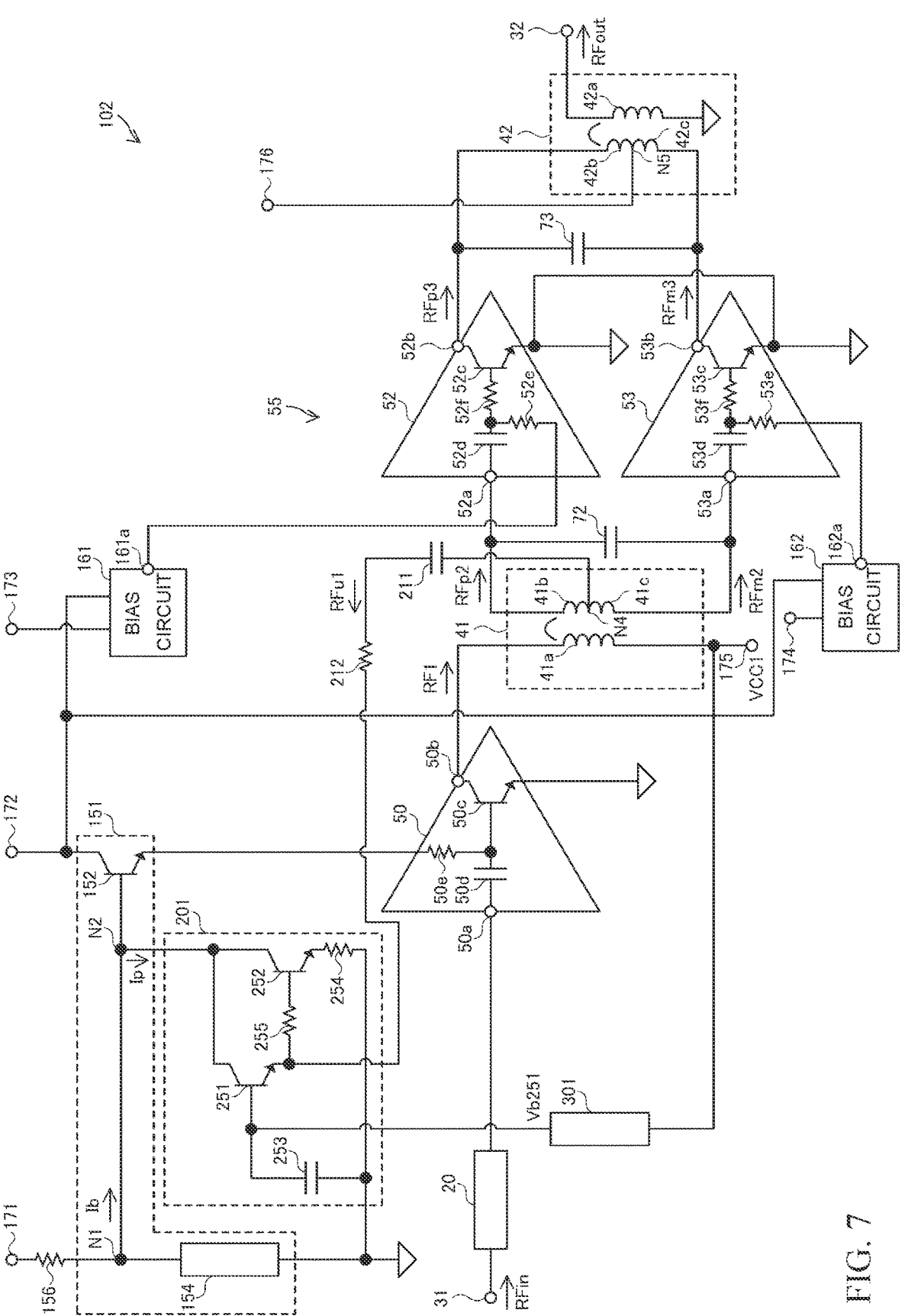
FIG. 7 is a circuit diagram of a power amplifier circuit 102.

FIG. 7 is a circuit diagram of the power amplifier circuit 102. As illustrated in FIG. 7, the power amplifier circuit 102 according to the second embodiment is different from the power amplifier circuit 101 according to the first embodiment in that the power stage includes a power-stage differential pair 55 (first differential pair).

Compared to the power amplifier circuit 101 illustrated in FIG. 1, the power amplifier circuit 102 includes a balun 41 (first balun) in place of the interstage matching circuit 21 and the inductor 26, and further includes a balun 42 (second balun), a power-stage amplifier 53, capacitors 72 and 73, and a power-stage bias supply circuit 162.

The power-stage amplifier 53 includes an input terminal 53a, an output terminal 53b, an amplifier transistor 53c (third amplifier), a capacitor 53d, and resistor elements 53e and 53f.

The balun 41 includes an inductor 41a (first inductor), an inductor 41b (second inductor), and an inductor 41c (third inductor). The balun 42 includes an inductor 42a (fourth inductor), an inductor 42b (fifth inductor), and an inductor 42c (sixth inductor).

Configurations of the power-stage amplifier 53 and the power-stage bias supply circuit 162 are similar to the configurations of the power-stage amplifier 52 and the power-stage bias supply circuit 161.

The balun 41 converts a single-end signal output from the driver-stage amplifier 50, that is, the amplification signal RF1, into amplification signals RFp2 and RFm2, which are differential signals. The balun 41 and the capacitor 72 match the impedance between the driver-stage amplifier 50 and the power-stage differential pair 55.

More particularly, the inductor 41a in the balun 41 includes a first end connected to the output terminal 50b of the driver-stage amplifier 50 and a second end connected to the power supply voltage supply terminal 175.

The inductor 41b includes a first end connected to the input terminal 52a of the power-stage amplifier 52 and a second end serving as a node N4 and is electromagnetically coupled to the inductor 41a. The emitter of the transistor 251 in the protection circuit 201 is connected to the node N4 with the resistor element 212 and the capacitor 211 interposed therebetween.

The inductor 41c includes a first end connected to the second end of the inductor 41b, that is, the node N4, and a second end connected to the input terminal 53a of the power-stage amplifier 53 and is electromagnetically coupled to the inductor 41a. The inductor 41c has an inductance substantially the same as the inductance of the inductor 41b.

That is, the inductor 41a is a primary-side inductor. The inductor 41b and the inductor 41c configure a secondary-side inductor. The node N4 is the midpoint of the secondary-side inductor.

The "midpoint" is not necessarily set in such a manner that the distance from one end of the secondary-side inductor to the midpoint is equal to the distance from the other end of the secondary-side inductor to the midpoint. The "midpoint" may be set in such a manner that the distance from one end of the secondary-side inductor to the midpoint is different from the distance from the other end of the secondary-side inductor to the midpoint. That is, the inductor 41c may have an inductance different from the inductance of the inductor 41b.

The capacitor 72 includes a first end connected to the input terminal 52a of the power-stage amplifier 52 and a second end connected to the input terminal 53a of the power-stage amplifier 53.

The power-stage differential pair 55 includes the power-stage amplifiers 52 and 53. The power-stage amplifier 52 amplifies the amplification signal RFp2 and outputs an amplification signal RFp3. The power-stage amplifier 53 amplifies the amplification signal RFm2 and outputs an amplification signal RFm3.

The capacitor 53d in the power-stage amplifier 53 includes a first end connected to the input terminal 53a, and a second end.

The amplifier transistor 53c includes a collector connected to the output terminal 53b, a base connected to the second end of the capacitor 53d with the resistor element 53f interposed therebetween, and an emitter connected to the ground. The resistor element 53e includes a first end connected to an output terminal 162a of the power-stage bias supply circuit 162 and a second end connected to the second end of the capacitor 53d.

The balun 42 converts the amplification signals RFp3 and RFm3 output from the power-stage amplifiers 52 and 53 into an output signal RFout, which is a single-end signal. The balun 42 and the capacitor 73 match the impedance between the power-stage differential pair 55 and a circuit arranged in a stage subsequent to the output terminal 32, that is, a load.

More particularly, the capacitor 73 includes a first end connected to the output terminal 52b of the power-stage amplifier 52 and a second end connected to the output terminal 53b of the power-stage amplifier 53.

The inductor 42b in the balun 42 includes a first end connected to the output terminal 52b of the power-stage amplifier 52 and a second end serving as a node N5. A power supply voltage of the power-stage amplifiers 52 and 53 is supplied from a power supply voltage supply terminal 176 to the node N5.

The inductor 42c includes a first end connected to the second end of the inductor 42b, that is, the node N5, and a second end connected to the output terminal 53b of the power-stage amplifier 53. The inductor 42c has an inductor substantially the same as the inductance of the inductor 42b.

The inductor 42a includes a first end connected to the output terminal 32 and a second end connected to the ground and is electromagnetically coupled to the inductors 42b and 42c.

That is, the inductors 42b and 42c configure a primary-side inductor. The inductor 42a is a secondary-side inductor. The node N5 is the midpoint of the primary-side inductor.

The "midpoint" is not necessarily set in such a manner that the distance from one end of the secondary-side inductor to the midpoint is equal to the distance from the other end of the secondary-side inductor to the midpoint. The "midpoint" may be set in such a manner that the distance from one end of the secondary-side inductor to the midpoint is different from the distance from the other end of the secondary-side inductor to the midpoint. That is, the inductor 42c may have an inductance different from the inductance of the inductor 42b.

Figure 8:
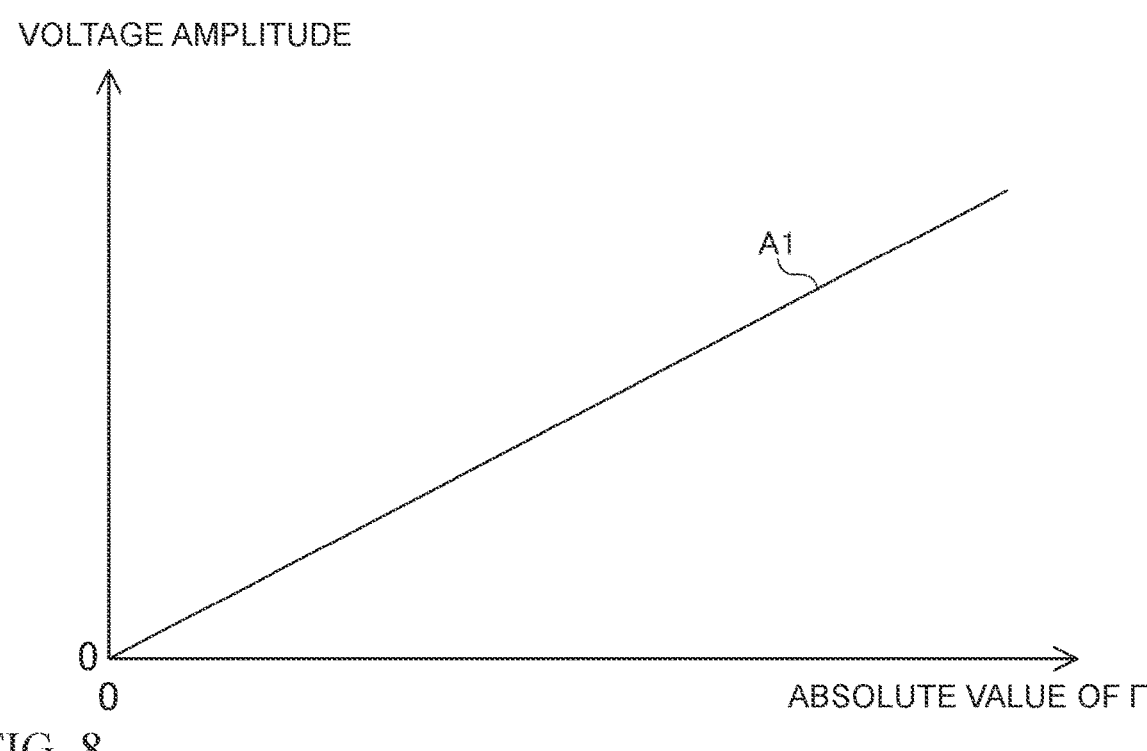
FIG. 8 is a diagram illustrating an example of an amplitude change A1 of voltage at a node N4 with respect to the absolute value of a reflection coefficient Γ when a circuit arranged in a stage subsequent to an output terminal 32 is viewed from the output terminal 32.

An operation of the power amplifier circuit 102 will be described below. FIG. 8 is a diagram illustrating an example of an amplitude change A1 of voltage at the node N4 with respect to the absolute value of a reflection coefficient Γ when a circuit arranged in a stage subsequent to the output terminal 32, that is, a load, is viewed from the output terminal 32. In FIG. 8, the horizontal axis represents the absolute value of the reflection coefficient Γ, and the vertical axis represents the amplitude of voltage at the node N4 of the balun 41.

As illustrated in FIG. 8, for example, when the impedance of the load connected to the output terminal 32 is 50 ohms, the absolute value of the reflection coefficient Γ is zero. When the impedance of the load is shifted from 50 ohms, the absolute value of the reflection coefficient Γ increases.

A balun in a differential amplifier is typically designed to be symmetrical when the impedance of the load is 50 ohms. In the case where the balun 41 operates symmetrically, differential signals cancel each other out at the node N4. That is, when the absolute value of the reflection coefficient Γ is zero, the voltage amplitude at the node N4 is zero.

When the impedance of the load is shifted from 50 ohms, the balun becomes asymmetrical. In the case where the balun 41 operates asymmetrically, the differential signals cannot cancel each other out completely. In this case, as indicated by the amplitude change A1, the voltage amplitude at the node N4 increases in accordance with the absolute value of the reflection coefficient Γ. That is, an RF signal RFu1 (third signal) is output from the node N4, and the protection circuit 201 thus operates.

Figure 9:
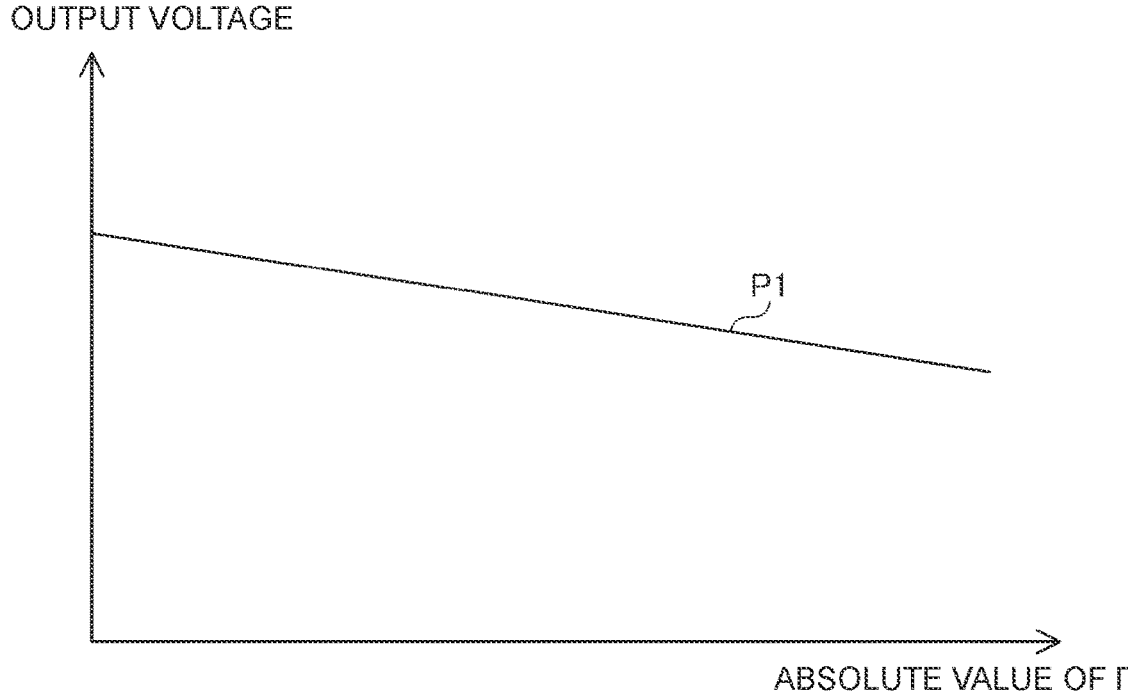
FIG. 9 is a diagram illustrating an example of an output power change P1 of a driver-stage amplifier 50 with respect to the absolute value of a reflection coefficient Γ when a circuit arranged in a stage subsequent to an output terminal 32 is viewed from the output terminal 32.

FIG. 9 is a diagram illustrating an example of an output power change P1 of the driver-stage amplifier 50 with respect to the absolute value of the reflection coefficient Γ when a circuit arranged in a stage subsequent to the output terminal 32, that is, the load, is viewed from the output terminal 32. In FIG. 9, the horizontal axis represents the absolute value of the reflection coefficient Γ, and the vertical axis represents power output from the driver-stage amplifier 50.

As illustrated in FIG. 9, when the impedance of the load is shifted from 50 ohms, the power supply voltage VCC1 becomes higher than 2Vbe+Vsft, and the RF amplitude of the amplification signal RF1 increases, the protection circuit 201 operates. When the protection circuit 201 operates, power output from the driver-stage amplifier 50 decreases, as indicated by the output power change P1. As a result, the driver-stage amplifier 50 and the power-stage amplifiers 52 and 53 are protected.

Third Embodiment

Figure 10:
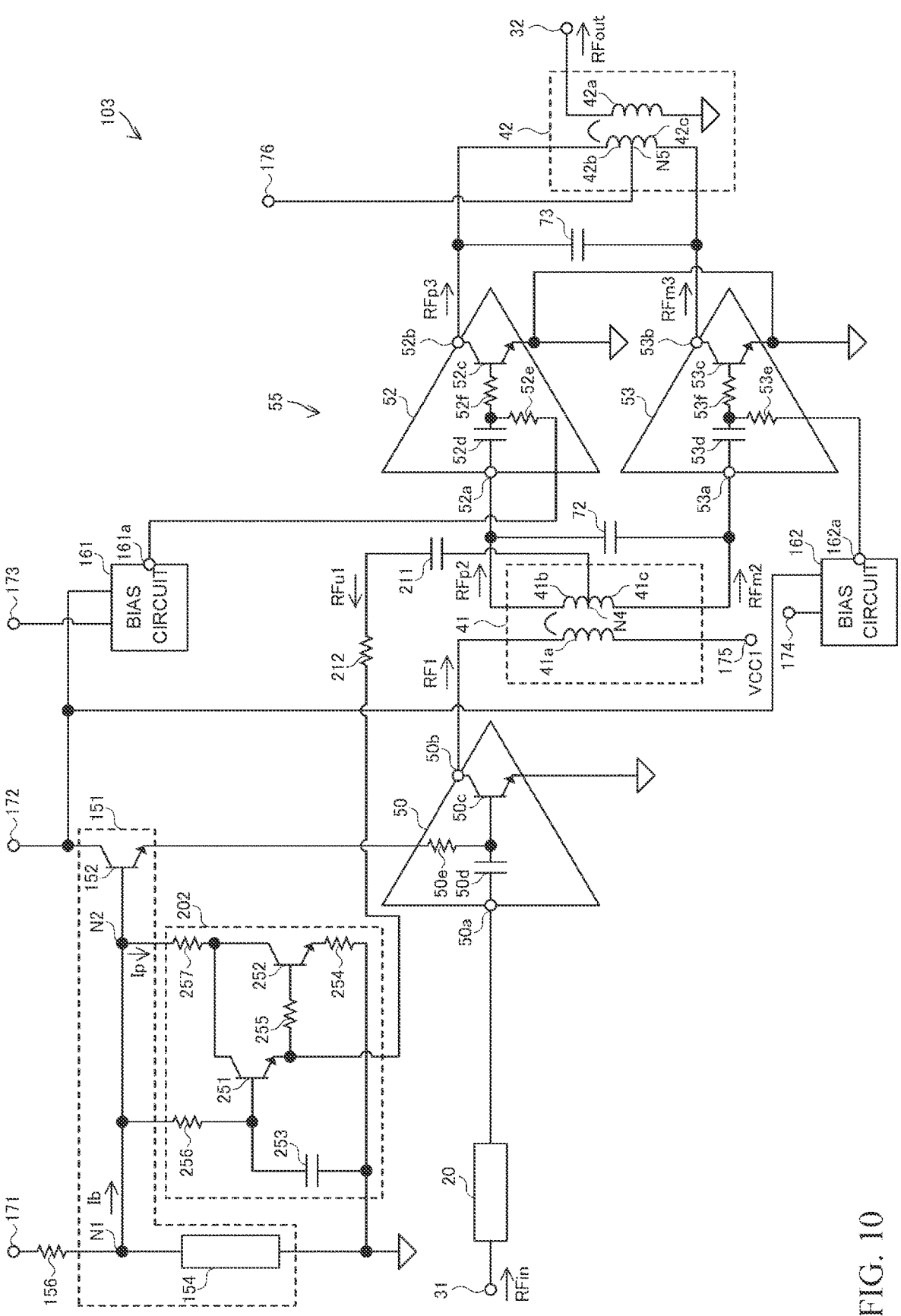
FIG. 10 is a circuit diagram of a power amplifier circuit 103.

A power amplifier circuit 103 according to a third embodiment will be described. FIG. 10 is a circuit diagram of the power amplifier circuit 103. As illustrated in FIG. 10, the power amplifier circuit 103 according to the third embodiment is different from the power amplifier circuit 102 according to the second embodiment in that a protection circuit operates regardless of the level of the power supply voltage VCC1.

Compared to the power amplifier circuit 102 illustrated in FIG. 7, the power amplifier circuit 103 includes a protection circuit 202 in place of the protection circuit 201. Compared to the protection circuit 201 illustrated in FIG. 7, the protection circuit 202 further includes resistor element 256 (second resistor element) and a resistor element 257.

The resistor element 256 includes a first end connected to the node N2, and a second end. The resistor element 257 includes a first end connected to the node N2, and a second end.

The transistor 251 includes a collector connected to the second end of the resistor element 257, a base connected to the second end of the resistor element 256 and the first end of the capacitor 253, and an emitter connected to the node N4 in the balun 41 with the resistor element 212 and the capacitor 211 interposed therebetween.

The transistor 252 includes a collector connected to the second end of the resistor element 257, a base connected to the emitter of the transistor 251 with the resistor element 255 interposed therebetween, and an emitter connected to the ground with the resistor element 254 interposed therebetween.

In the power amplifier circuit 102 illustrated in FIG. 7, when the power supply voltage VCC1 becomes higher than 2Vbe+Vsft, the protection circuit 201 is transitioned from OFF state to ON state, and this transition may cause sudden current flow. At this time, the characteristics of the amplifiers may be largely degraded.

In contrast, in the power amplifier circuit 103 illustrated in FIG. 10, since a bias current is constantly supplied to the base of the transistor 251 from the current supply terminal 171 through the resistor elements 156 and 256, the protection circuit 202 is always in the ON state.

Thus, sudden current flow in the protection circuit 202 can be suppressed, and degradation of the characteristics of the amplifiers can be reduced.

Therefore, in the power amplifier circuit 103, regardless of the level of the power supply voltage VCC1, when the impedance of the load is shifted from 50 ohms and the RF amplitude of the amplification signal RF1 increases, the protection circuit 202 operates.

Fourth Embodiment

Figure 11:
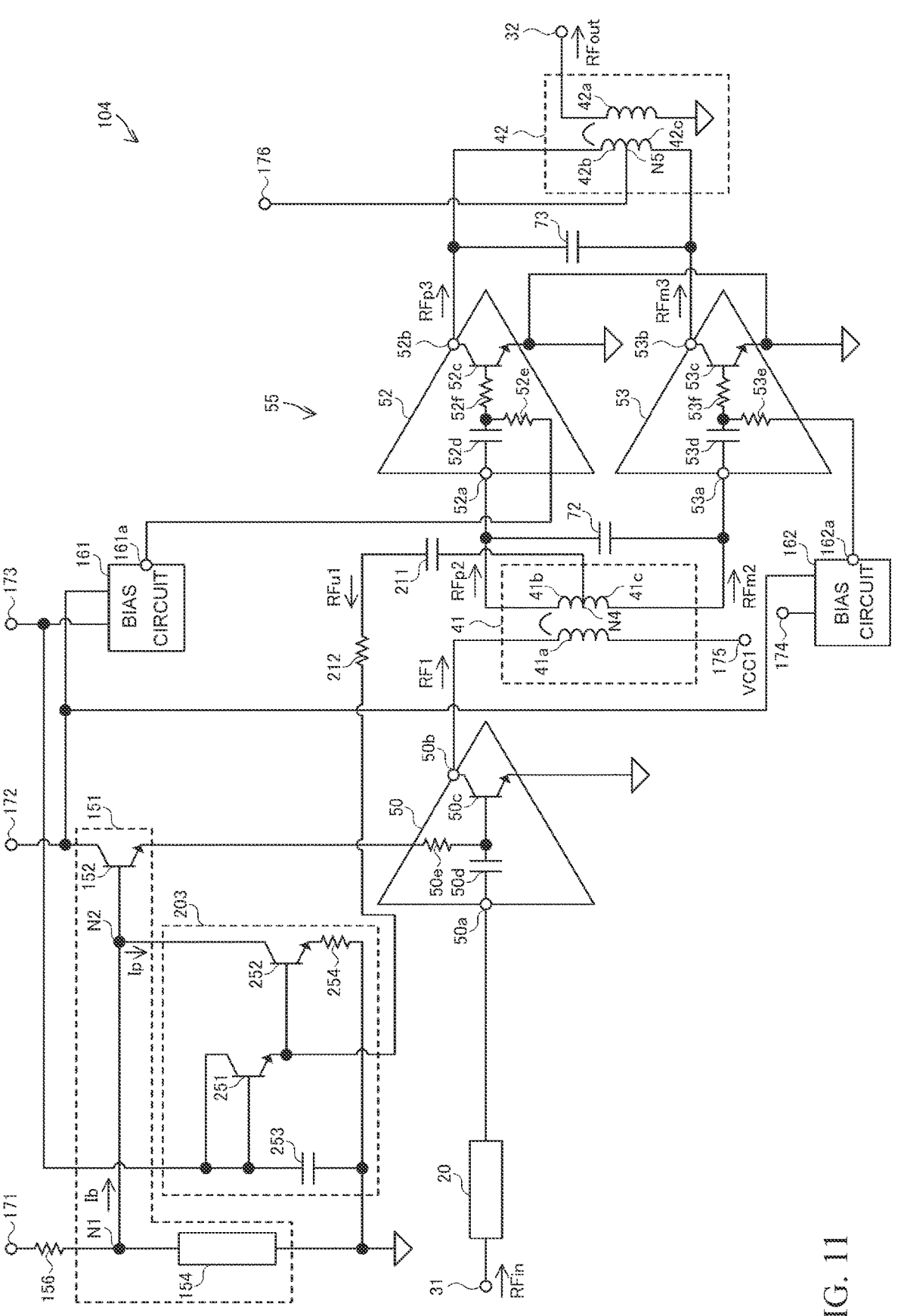
FIG. 11 is a circuit diagram of a power amplifier circuit 104.

A power amplifier circuit 104 according to a fourth embodiment will be described. FIG. 11 is a circuit diagram of the power amplifier circuit 104. As illustrated in FIG. 11, the power amplifier circuit 104 according to the fourth embodiment is different from the power amplifier circuit 103 according to the third embodiment in that a bias of the transistor 251 in a protection circuit is supplied from the control signal supply terminal 173.

Compared to the power amplifier circuit 103 illustrated in FIG. 10, the power amplifier circuit 104 includes a protection circuit 203 in place of the protection circuit 202. Compared to the protection circuit 202 illustrated in FIG. 10, the protection circuit 203 includes none of the resistor elements 255, 256, and 257.

The transistor 251 is in the first diode connection state and includes a collector and a base that are connected to the control signal supply terminal 173 and the first end of the capacitor 253 and an emitter connected to the node N4 in the balun 41 with the resistor element 212 and the capacitor 211 interposed therebetween.

The transistor 252 includes a collector connected to the node N2, a base connected to the emitter of the transistor 251, and an emitter connected to the ground with the resistor element 254 interposed therebetween.

In the power amplifier circuit 103 illustrated in FIG. 10, the bias transistor 152 and the transistors 251 and 252 are biased from the current supply terminal 171. With this configuration, when the current supplied from the current supply terminal 171 is increased so that the base bias of the driver-stage amplifier 50 increases, the collector currents of the transistors 251 and 252 also increase. Thus, it is difficult to adjust the operation of the protection circuit 202 and the bias of the driver-stage amplifier 50 independently.

In contrast, in the power amplifier circuit 104 illustrated in FIG. 11, by providing the current supply terminal 171 that supplies a bias to the bias transistor 152 and the control signal supply terminal 173 that supplies a bias to the transistors 251 and 252 in different systems, operation of the protection circuit 203 and the bias of the driver-stage amplifier 50 can be adjusted independently.

The collector of the transistor 251 may be connected to a new control terminal that is different from the current supply terminal 171 and the control signal supply terminal 173. With this arrangement, the operation of the protection circuit 203 and the bias of the power-stage amplifier 52 can be adjusted independently. However, provision of a new control terminal may increase the chip size. Thus, as illustrated in FIG. 11, an arrangement in which the collector of the transistor 251 is connected to the control signal supply terminal 173, which reduces the chip size, is desirable.

Fifth Embodiment

Figure 12:
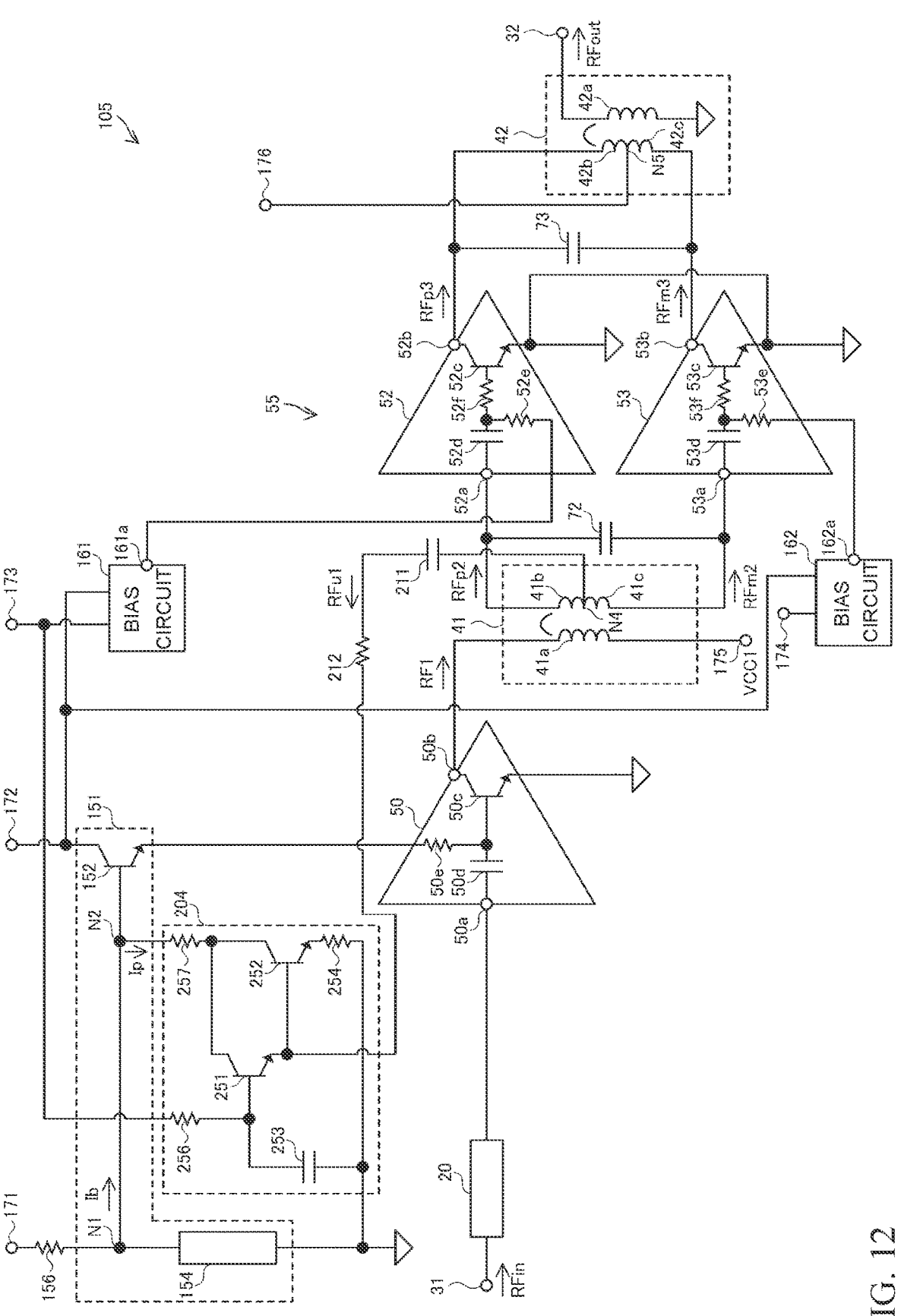
FIG. 12 is a circuit diagram of a power amplifier circuit 105.

A power amplifier circuit 105 according to a fifth embodiment will be described. FIG. 12 is a circuit diagram of the power amplifier circuit 105. As illustrated in FIG. 12, the power amplifier circuit 105 according to the fifth embodiment is different from the power amplifier circuit 104 according to the fourth embodiment in that the collector currents of the transistors 251 and 252 are supplied from the current supply terminal 171.

Compared to the power amplifier circuit 104 illustrated in FIG. 11, the power amplifier circuit 105 includes a protection circuit 204 in place of the protection circuit 203. Compared to the protection circuit 203 illustrated in FIG. 11, the protection circuit 204 further includes resistor elements 256 and 257.

The resistor element 256 includes a first end connected to the control signal supply terminal 173, and a second end. The resistor element 257 includes a first end connected to the node N2, and a second end.

The transistor 251 includes a collector connected to the second end of the resistor element 257, a base connected to the second end of the resistor element 256 and the first end of the capacitor 253, and an emitter connected to the node N4 in the balun 41 with the resistor element 212 and the capacitor 211 interposed therebetween.

The transistor 252 includes a collector connected to the second end of the resistor element 257, a base connected to the emitter of the transistor 251, and an emitter connected to the ground with the resistor element 254 interposed therebetween.

Sixth Embodiment

Figure 13:
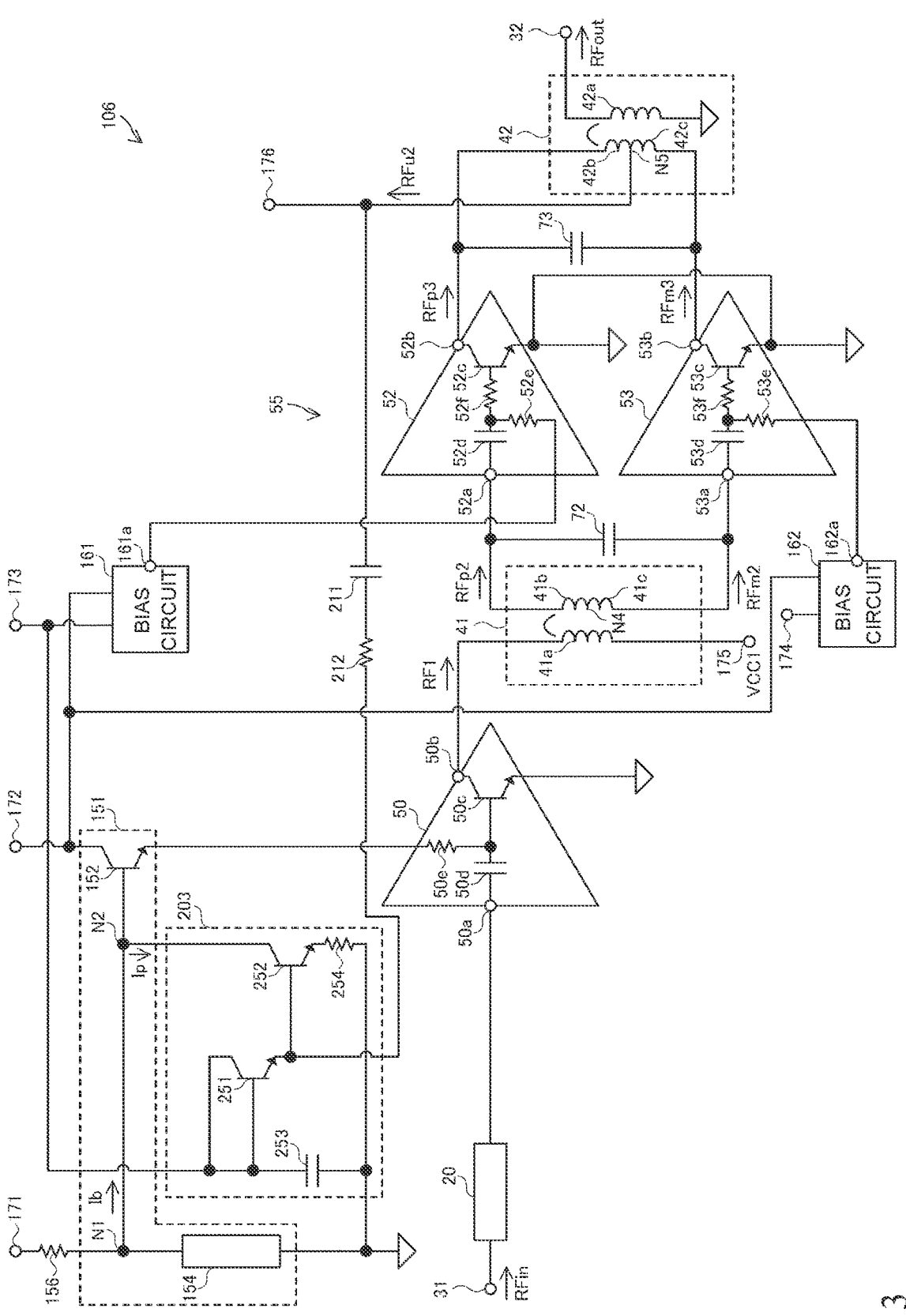
FIG. 13 is a circuit diagram of a power amplifier circuit 106

A power amplifier circuit 106 according to a sixth embodiment will be described. FIG. 13 is a circuit diagram of the power amplifier circuit 106. As illustrated in FIG. 13, the power amplifier circuit 106 according to the sixth embodiment is different from the power amplifier circuit 104 according to the fourth embodiment in that the emitter of the transistor 251 is connected to the node N5 in the balun 42 with the resistor element 212 and the capacitor 211 interposed therebetween.

For example, in the case where the impedance of the load connected to the output terminal 32 is 50 ohms, the balun 42 operates symmetrically. At this time, at the node N5, differential signals cancel each other out. Thus, the voltage amplitude at the node N5 is zero.

When the impedance of the load is shifted from 50 ohms, the balun 42 operates asymmetrically. At this time, at the node N5, differential signals cannot cancel each other out completely. Thus, the voltage amplitude at the node N5 increases in accordance with the absolute value of the reflection coefficient F. That is, an RF signal RFu2 (third signal) is output from the node N5, and the protection circuit 203 thus operates.

Seventh Embodiment

Figure 14:
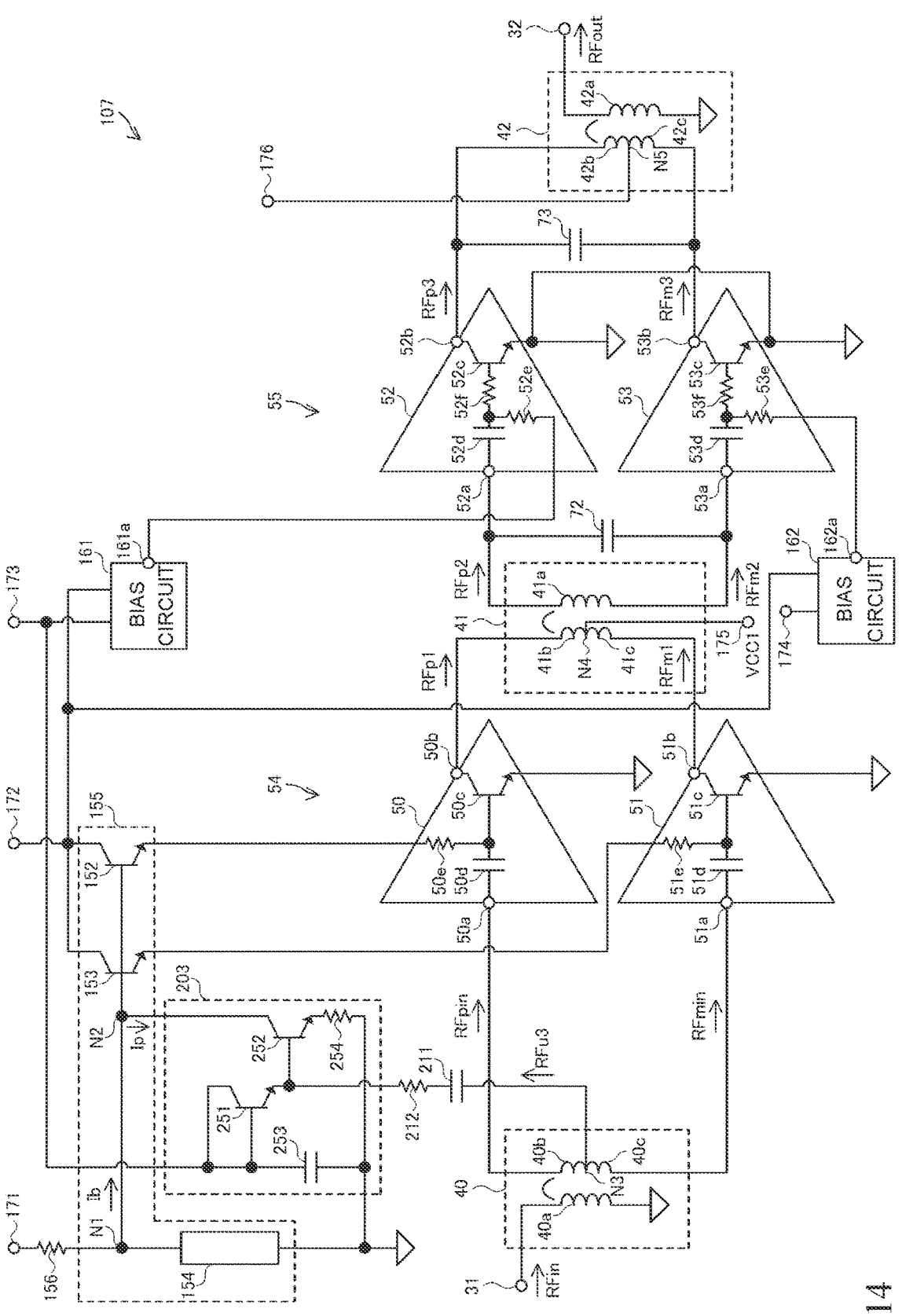
FIG. 14 is a circuit diagram of a power amplifier circuit 107.

A power amplifier circuit 107 according to a seventh embodiment will be described. FIG. 14 is a circuit diagram of the power amplifier circuit 107. As illustrated in FIG. 14, the power amplifier circuit 107 according to the seventh embodiment is different from the power amplifier circuit 104 according to the fourth embodiment in that the driver stage also includes a differential pair.

Compared to the power amplifier circuit 104 illustrated in FIG. 11, the power amplifier circuit 107 includes a balun 40 (third balun) and a driver-stage bias supply circuit 155 in place of the input matching circuit 20 and the driver-stage bias supply circuit 151, and further includes a driver-stage amplifier 51.

The balun 40 includes an inductor 40a (seventh inductor), an inductor 40b (eighth inductor), and an inductor 40c (ninth inductor). The driver-stage amplifier 51 includes an input terminal 51a, an output terminal 51b, an amplifier transistor 51c (fourth amplifier), a capacitor 51d, and a resistor element 51e.

Compared to the driver-stage bias supply circuit 151 illustrated in FIG. 11, the driver-stage bias supply circuit 155 further includes a bias transistor 153. The configuration of the driver-stage amplifier 51 is similar to the configuration of the driver-stage amplifier 50.

The balun 40 converts a single-end signal suppled from the input terminal 31, that is, the input signal RFin, into signals RFpin and RFmin, which are differential signals. The balun 40 matches the impedance between a circuit arranged in a stage preceding the input terminal 31 and the driver-stage amplifiers 50 and 51.

More particularly, the inductor 40a in the balun 40 includes a first end connected to the input terminal 31 and a second end connected to the ground. The inductor 40b includes a first end connected to the input terminal 50a of the driver-stage amplifier 50 and a second end serving as the node N3 and is electromagnetically coupled to the inductor 40a. The emitter of the transistor 251 in the protection circuit 203 is connected to the node N3 with the resistor element 212 and the capacitor 211 interposed therebetween.

The inductor 40c includes a first end connected to the second end of the inductor 40b, that is, the node N3, and a second end connected to the input terminal 51a of the driver-stage amplifier 51 and is electromagnetically coupled to the inductor 40*a*. The inductor 40*c* has an inductance substantially the same as the inductance of the inductor 40*b*.

That is, the inductor 40*a* is a primary-side inductor. The inductors 40*b* and 40*c* configure a secondary-side inductor. The node N3 is the midpoint of the secondary-side inductor.

The "midpoint" is not necessarily set in such a manner that the distance from one end of the secondary-side inductor to the midpoint is equal to the distance from the other end of the secondary-side inductor to the midpoint. The "midpoint" may be set in such a manner that the distance from one end of the secondary-side inductor to the midpoint is different from the distance from the other end of the secondary-side inductor to the midpoint. That is, the inductor 40*c* may have an inductance different from the inductance of the inductor 40*b*.

A driver-stage differential pair 54 (second differential pair) includes the driver-stage amplifiers 50 and 51. The driver-stage amplifier 50 amplifies the signal RFpin and outputs an amplification signal RFp1. The driver-stage amplifier 51 amplifies the signal RFmin and outputs an amplification signal RFm1.

The capacitor 51*d* in the driver-stage amplifier 51 includes a first end connected to the input terminal 51*a*, and a second end.

The amplifier transistor 51*c* includes a collector connected to the output terminal 51*b*, a base connected to the second end of the capacitor 51*d*, and an emitter connected to the ground. The resistor element 51*e* includes a first end, and a second end connected to the second end of the capacitor 51*d*.

The bias transistor 153 in the driver-stage bias supply circuit 155 includes a collector connected to the battery voltage supply terminal 172, a base connected to the node N2, and an emitter connected to the first end of the resistor element 51*e* in the driver-stage amplifier 51.

The balun 41 and the capacitor 72 match the impedance between the driver-stage differential pair 54 and the power-stage differential pair 55.

More particularly, the inductor 41*b* in the balun 41 includes a first end connected to the output terminal 50*b* of the driver-stage amplifier 50 and a second end serving as the node N4. A power supply voltage of the driver-stage amplifiers 50 and 51 is supplied from the power supply voltage supply terminal 175 to the node N4.

The inductor 41*c* includes a first end connected to the second end of the inductor 41*b*, that is, the node N4, and a second end connected to the output terminal 51*b* of the driver-stage amplifier 51.

The inductor 41*a* includes a first end connected to the input terminal 52*a* of the power-stage amplifier 52 and a second end connected to the input terminal 53*a* of the power-stage amplifier 53 and is electromagnetically coupled to the inductors 41*b* and 41*c*.

That is, the inductors 41*b* and 41*c* configure a primary-side inductor. The inductor 41*a* is a secondary-side inductor. The node N4 is the midpoint of the primary-side inductor.

For example, when the impedance of the load connected to the output terminal 32 is 50 ohms, the balun 40 operates symmetrically. At this time, at the node N3, differential signals cancel each other out. Thus, the voltage amplitude at the node N3 is zero.

When the impedance of the load is shifted from 50 ohms, the balun 40 operates asymmetrically. At this time, at the node N3, differential signals cannot cancel each other out completely, and the voltage amplitude at the node N3 increases in accordance with the absolute value of the reflection coefficient Γ. That is, an RF signal RFu3 (third signal) is output from the node N3, and the protection circuit 203 thus operates.

Eighth Embodiment

Figure 15:
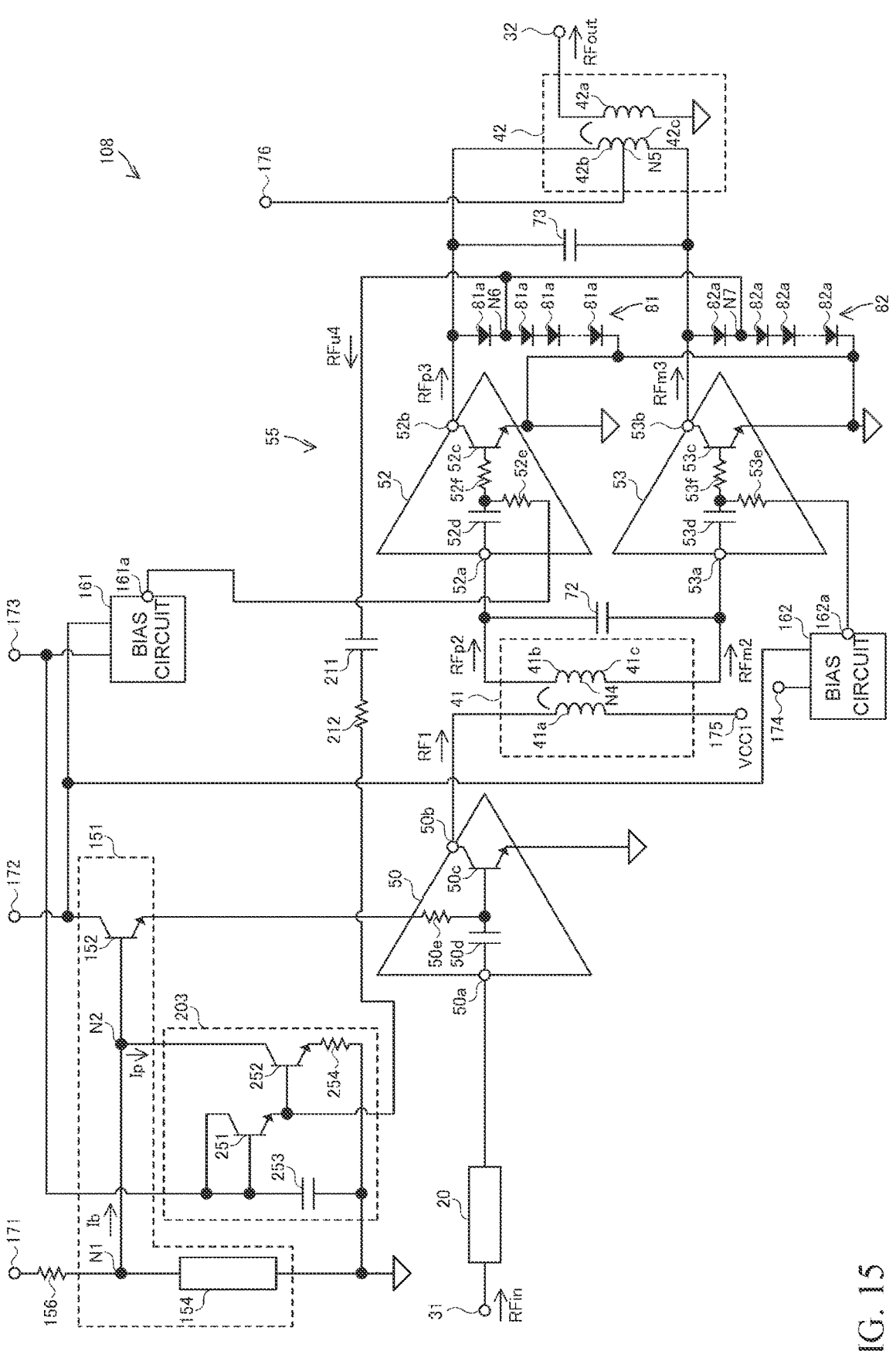
FIG. 15 is a circuit diagram of a power amplifier circuit 108.

A power amplifier circuit 108 according to an eighth embodiment will be described. FIG. 15 is a circuit diagram of the power amplifier circuit 108. As illustrated in FIG. 15, the power amplifier circuit 108 according to the eighth embodiment is different from the power amplifier circuit 106 according to the sixth embodiment in including a clamp circuit.

Compared to the power amplifier circuit 106 illustrated in FIG. 13, the power amplifier circuit 108 further includes a clamp circuit 81 (first clamp circuit) and a clamp circuit 82 (second clamp circuit). The clamp circuit 81 includes M (M represents an integer of 1 or more) diodes 81*a* (second diodes). The clamp circuit 82 includes M diodes 82*a* (third diodes).

In the case where M represents 1, the diode 81*a* in the clamp circuit 81 includes an anode connected to the output terminal 52*b* of the power-stage amplifier 52 and a cathode connected to the ground. In the clamp circuit 81, a node N6 is arranged between the diode 81*a* and the ground.

The diode 82*a* in the clamp circuit 82 includes an anode connected to the output terminal 53*b* of the power-stage amplifier 53 and a cathode connected to the ground. In the clamp circuit 82, a node N7 is arranged between the diode 82*a* and the ground.

In the case where M represents 2 or more, the M diode 81*a* in the clamp circuit 81 are connected in series between the output terminal 52*b* of the power-stage amplifier 52 and the ground in such a manner that the anodes of the diodes 81*a* are close to the output terminal 52*b* of the power-stage amplifier 52.

In the clamp circuit 81, the node N6 is arranged between the Kth diode 81*a* (K represents an integer between 1 and (M−1), both inclusive) and the (K+1)th diode 81*a* from the diode 81*a* closest to the output terminal 52*b* of the power-stage amplifier 52.

The M diodes 82*a* in the clamp circuit 82 are connected in series between the output terminal 53*b* of the power-stage amplifier 53 and the ground in such a manner that the anodes of the diodes 82*a* are close to the output terminal 53*b* of the power-stage amplifier 53.

In the clamp circuit 82, the node N7 is arranged between the Kth diode 82*a* and the (K+1)th diode 82*a* from the diode 82*a* closest to the output terminal 53*b* of the power-stage amplifier 53.

The emitter of the transistor 251 is connected to the nodes N6 and N7 with the resistor element 212 and the capacitor 211 interposed therebetween.

For example, when the impedance of the load connected to the output terminal 32 is 50 ohms, the balun 42 operates symmetrically. Even in the case where the balun 42 operates symmetrically, if the amplitudes of the amplification signals RFp3 and RFm3 are large, voltage amplitude occurs at the nodes N6 and N7. That is, RF signals RFu4 (third signals) are output from the node N6 and N7, and the protection circuit 203 thus operates.

When the impedance of the load is shifted from 50 ohms, the balun 42 operates asymmetrically. When the balun 42 operates asymmetrically, voltage amplitude occurs at the nodes N6 and N7. That is, the RF signals RFu4 are output from the nodes N6 and N7, and the protection circuit 203 thus operates.

It is often the case that the power-stage differential pair 55 and the clamp circuits 81 and 82 are formed at a semiconductor substrate and the balun 42 is formed at a module substrate. Thus, in the power amplifier circuit 106 illustrated in FIG. 13, wiring from the node N5 at the module substrate to the emitter of the transistor 251 at the semiconductor substrate is not provided easily.

In contrast, in the power amplifier circuit 108, wiring from the nodes N6 and N7 to the emitter of the transistor 251 at the semiconductor substrate can be easily provided.

Although the protection circuits 201 to 204 that are each arranged to include the resistor element 254 has been described above, each of the protection circuits 201 to 204 is not necessarily arranged as described above. Each of protection circuits 201 to 204 may be arranged in such a manner that the emitter of the transistor 252 is directly connected to the ground, without necessarily the resistor element 254 being provided.

Furthermore, although the protection circuits 201 and 202 that are each arranged to include the resistor element 255 has been described above, each of the protection circuits 201 and 202 is not necessarily arranged as described above. Each of the protection circuits 201 and 202 may be arranged in such a manner that the base of the transistor 252 is directly connected to the emitter of the transistor 251, without necessarily the resistor element 255 being provided.

Furthermore, although the protection circuits 202 and 204 that are each arranged to include the resistor element 257 has been described above, each of the protection circuits 202 and 204 is not necessarily arranged as described above. Each of the protection circuits 202 and 204 may be arranged in such a manner that the collector of the transistor 251 and the collector and the base of the transistor 252 are directly connected to the base of the bias transistor 152, without necessarily the resistor element 257 being provided.

Furthermore, although the power amplifier circuits 103, 104, and 105 that are each arranged in such a manner that the second end of the inductor 41a in the balun 41 is connected to the power supply voltage supply terminal 175 has been described above, each of the power amplifier circuits 103, 104, and 105 is not necessarily arranged as described above. Each of the power amplifier circuits 103, 104, and 105 may be arranged in such a manner that the second end of the inductor 41a is connected to the ground or the like as long as it is a node that can be viewed as a low impedance.

Exemplary embodiments of the present disclosure have been described above. In the power amplifier circuits 101 and 102, the amplifier transistor 50c operates in accordance with the power supply voltage VCC1 supplied from the power supply voltage supply terminal 175, amplifies the input signal RFin, and outputs the amplification signal RF1. The bias transistor 152 includes the base to which the bias control current Ib is supplied and the emitter that supplies a bias to the amplifier transistor 50c through the resistor element 50e. The protection circuit 201 causes the protection current Ip, which is part of the bias control current Ib, to flow to the ground, on the basis of the amplification signal RF1 and the base voltage Vb251 based on the power supply voltage VCC1.

With the arrangement described above, when the power supply voltage VCC1 varies and increases and the output power of the amplification signal RF1 increases, part of the bias control current Ib can be caused to flow as the protection current Ip to the ground, and the current supplied to the base of the bias transistor 152 can be decreased. Thus, because the bias supplied to the amplifier transistor 50c can be decreased, the power output from the amplifier transistor 50c can be decreased, and the power output from the amplifier transistor 50c and an amplifier connected to a stage subsequent to the amplifier transistor 50c can be prevented from becoming too high. Therefore, breakage of the amplifiers can be suppressed.

Furthermore, the protection circuit 201 in each of the power amplifier circuits 101 and 102, the transistor 251 includes the base connected to the ground with the capacitor 253 interposed therebetween and the emitter to which the amplification signal RF1 is input through the capacitor 211. The transistor 252 includes the collector connected to the base of the bias transistor 152, the base connected to the emitter of the transistor 251, and the emitter connected to the ground.

With the arrangement described above, the voltage of the base of the transistor 251 can be maintained substantially constant by the capacitor 253. The average voltage of the emitter of the transistor 251 increases in accordance with the size of the amplitude of the amplification signal RF1. When the amplitude of the amplification signal RF1 increases, the average voltage of the emitter of the transistor 251 increases, and the transistor 252 can be turned on, which causes the protection current Ip to flow from the collector of the transistor 252 to the ground. That is, the transistor 252 is turned on when the output power of the amplification signal RF1 increases, and a circuit that causes part of the bias control current Ib, which is supplied to the base of the bias transistor 152, to flow as the protection current Ip to the ground, can be achieved.

Furthermore, in the power amplifier circuits 102 to 108, the amplifier transistor 50c supplies power to the load. The bias transistor 152 includes the base to which the bias control current Ib is supplied and the emitter that supplies a bias to the amplifier transistor 50c through the resistor element 50e. Each of the protection circuits 201 to 204 causes the protection current Ip, which is part of the bias control current Ib, to flow to the ground, on the basis of the RF signal RFu1, RFu2, RFu3, or RFu4 based on a change in the load.

For example, in the case where a differential pair supplies power to the load, if the load varies, the balance of differential signals may be lost, which may cause power output from one of the amplifiers configuring the differential pair to become too high. With the arrangement described above, when the load varies and power output from one of the amplifiers configuring the differential pair becomes too high, part of the bias control current Ib can be caused to flow as the protection current Ip to the ground. Thus, the current supplied to the base of the bias transistor 152 can be decreased. Therefore, because the bias supplied to the amplifier transistor 50c can be decreased, the power output from the amplifier transistor 50c can be decreased, and the power output from the amplifier transistor 50c and the differential pair connected to a stage subsequent to the amplifier transistor 50c can be prevented from becoming too high. Thus, breakage of the amplifiers can be suppressed.

Furthermore, in the power amplifier circuit 102, the amplifier transistor 50c operates in accordance with the power supply voltage VCC1 supplied from the power supply voltage supply terminal 175. The protection circuit 201 causes the protection current Ip to flow to the ground on the basis of the base voltage Vb251 based on the power supply voltage VCC1.

With the arrangement described above, when the power supply voltage VCC1 varies and increases and the output power of the amplification signal RF1 increases, part of the bias control current Ib can be caused to flow as the protection current Ip to the ground. Thus, the current supplied to the base of the bias transistor 152 can be decreased. Therefore, because the bias supplied to the amplifier transistor 50*c* can be decreased, the power output from the amplifier transistor 50*c* can be decreased, and the power output from the amplifier transistor 50*c* and the differential pair connected to a stage subsequent to the amplifier transistor 50*c* can be prevented from becoming too high. Thus, breakage of the amplifiers can be suppressed.

Furthermore, in the protection circuits 201 to 204 in the power amplifier circuits 102 to 108, the transistor 251 includes the base connected to the ground with the capacitor 253 interposed therebetween and the emitter to which the RF signal RFu1, RFu2, RFu3, or RFu4 is input through the capacitor 211. The transistor 252 includes the collector connected to the base of the bias transistor 152, the base connected to the emitter of the transistor 251, and the emitter connected to the ground.

With the arrangement described above, the voltage of the base of the transistor 251 can be maintained substantially constant by the capacitor 253. The average voltage of the emitter of the transistor 251 increases in accordance with the size of the amplitude of the RF signal RFu1, RFu2, RFu3, or RFu4. When the impedance of the load varies and the amplitude of the RF signal RFu1, RFu2, RFu3, or RFu4 increases, the average voltage of the emitter of the transistor 251 increases, and the transistor 252 can be turned on. Thus, the protection current Ip can be caused to flow to the ground from the collector of the transistor 252. That is, the transistor 252 can be turned on when the impedance of the load varies, and a circuit that causes part of the bias control current Ib, which is supplied to the base of the bias transistor 152, to flow as the protection current Ip to the ground, can be achieved.

Furthermore, in the power amplifier circuits 101 and 102, the amplifier transistor 50*c* operates in accordance with the power supply voltage VCC1 supplied from the power supply voltage supply terminal 175. The base of the transistor 251 in the protection circuit 201 is connected to the power supply voltage supply terminal 175.

With the arrangement described above, the transistor 251 can be turned on or turned off in accordance with the power supply voltage VCC1. Thus, the protection circuit 201 can be caused to operate when the power supply voltage VCC1 supplied to the amplifier transistor 50*c* increases, whereas the protection circuit 201 can be caused to stop when the power supply voltage VCC1 decreases.

Furthermore, in the power amplifier circuits 101 and 102, the voltage level shift circuit 301 is connected between the base of the transistor 251 in the protection circuit 201 and the power supply voltage supply terminal 175 and shifts the power supply voltage VCC1.

With the arrangement described above, when the power supply voltage VCC1 becomes higher than the sum of the voltage Vbe between the base and the emitter of the transistor 251, the voltage Vbe between the base and the emitter of the transistor 252, and the shift voltage Vsft of the voltage level shift circuit 301, the protection circuit 201 can be caused to operate. Thus, by appropriately setting the shift voltage Vsft, the operation starting voltage of the protection circuit 201 can be adjusted.

Furthermore, in the power amplifier circuits 101 and 102, the voltage level shift circuit 301 includes one or more first diodes.

With the arrangement described above, the shift voltage Vsft can be adjusted using a simple method for appropriately setting the number of first diodes.

Furthermore, in the protection circuit 202 in the power amplifier circuit 103, the base of the transistor 251 is connected to the base of the bias transistor 152.

With the arrangement described above, the protection circuit 202 can be caused to operate regardless of the value of the power supply voltage VCC1, and sudden current flow in the protection circuit 202 can be suppressed. Thus, degradation in the characteristics of the amplifiers can be suppressed.

Furthermore, in the power amplifier circuit 103, the resistor element 256 is connected between the base of the transistor 251 and the base of the bias transistor 152.

With the arrangement described above, a voltage supplied to the base of the transistor 251 can be adjusted using a simple method for appropriately setting the resistance of the resistor element 256.

Furthermore, in the power amplifier circuits 104 to 108, the amplifier transistor 52*c* is provided in a stage subsequent to the amplifier transistor 50*c*. The power-stage bias supply circuit 161 is controlled in accordance with a current supplied from the control signal supply terminal 173 and supplies a bias to the amplifier transistor 52*c*. The base of the transistor 251 is connected to the control signal supply terminal 173.

For example, in the case where the bias of the transistor 251 is supplied from the current supply terminal 171, if a current supplied from the current supply terminal 171 is increased so that the base bias of the amplifier transistor 50*c* increases, collector currents of the transistors 251 and 252 also increase. Thus, it is difficult to adjust the operation of the protection circuit and the bias of the amplifier transistor 50*c* independently. With the arrangement described above, since the current supply terminal 171 that supplies a bias to the bias transistor 152 and the control signal supply terminal 173 that supplies a bias to the transistors 251 and 252 are provided in different systems, the operation of the protection circuit and the bias of the amplifier transistor 50*c* can be adjusted independently.

Furthermore, in the power amplifier circuits 102 to 105, the power-stage differential pair 55 includes the amplifier transistors 52*c* and 53*c* and is provided in a stage subsequent to the amplifier transistor 50*c*. The balun 41 is provided between the amplifier transistor 50*c* and the power-stage differential pair 55. In the balun 41, the inductor 41*a* includes the first end connected to the output terminal 50*b* of the driver-stage amplifier 50 and the second end connected to the power supply voltage supply terminal 175. The inductor 41*b* includes the first end connected to the input terminal 52*a* of the power-stage amplifier 52 and the second end from which the RF signal RFu1 is output and is electromagnetically coupled to the inductor 41*a*. The inductor 41*c* includes the first end connected to the second end of the inductor 41*b* and the second end connected to the input terminal 53*a* of the power-stage amplifier 53 and is electromagnetically coupled to the inductor 41*a*.

Typically, when the impedance of the load is, for example, 50 ohms, the balun 41 operates symmetrically, and differential signals cancel each other out at the second end of the inductor 41*b*, that is, the first end of the inductor 41*c*. Thus, the voltage amplitude of the RF signal RFu1 is zero. In contrast, when the impedance of the load is shifted from 50 ohms, the balun 41 operates asymmetrically, and differential signals cannot cancel each other out completely at the second end of the inductor 41*b*. In this case, the voltage amplitude of the RF signal RFu1 increases. That is, the amplitude of the RF signal RFu1 output from the second end of the inductor 41b increases, and the protection circuit can thus be caused to operate.

Furthermore, in the power amplifier circuit 106, the power-stage differential pair 55 includes the amplifier transistors 52c and 53c and is provided in a stage subsequent to the amplifier transistor 50c. The balun 42 is provided in a stage subsequent to the power-stage differential pair 55. In the balun 42, the inductor 42a includes the first end connected to the output terminal 32 and the second end connected to the ground. The inductor 42b includes the first end connected to the output terminal 52b of the power-stage amplifier 52 and the second end from which the RF signal RFu2 is output and is electromagnetically coupled to the inductor 42a. The inductor 42c includes the first end connected to the second end of the inductor 42b and the second end connected to the output terminal 53b of the power-stage amplifier 53 and is electromagnetically coupled to the inductor 42a.

Typically, when the impedance of the load is, for example, 50 ohms, the balun 42 operates symmetrically, and differential signals cancel each other out at the second end of the inductor 42b, that is, the first end of the inductor 42c. Thus, the voltage amplitude of the RF signal RFu2 is zero. In contrast, when the impedance of the load is shifted from 50 ohms, the balun 42 operates asymmetrically, and differential signals cannot cancel each other out completely at the second end of the inductor 42b. In this case, the voltage amplitude of the RF signal RFu2 increases. That is, the amplitude of the RF signal RFu2 output from the second end of the inductor 42b increases, and the protection circuit can thus be caused to operate.

Furthermore, in the power amplifier circuit 107, the amplifier transistor 51c and the amplifier transistor 50c form the driver-stage differential pair 54. The balun 40 is provided in a stage preceding the driver-stage differential pair 54. In the balun 40, the inductor 40a includes the first end connected to the input terminal 31 and the second end connected to the ground. The inductor 40b includes the first end connected to the input terminal 50a of the driver-stage amplifier 50 and the second end from which the RF signal RFu3 is output and is electromagnetically coupled to the inductor 40a. The inductor 40c includes the first end connected to the second end of the inductor 40b and the second end connected to the input terminal 51a of the driver-stage amplifier 51 and is electromagnetically coupled to the inductor 40a.

Typically, when the impedance of the load is, for example, 50 ohms, the balun 40 operates symmetrically, and differential signals cancel each other out at the second end of the inductor 40b, that is, the first end of the inductor 40c. Thus, the voltage amplitude of the RF signal RFu3 is zero. In contrast, when the impedance of the load is shifted from 50 ohms, the balun 40 operates asymmetrically, and differential signals cannot cancel each other out completely at the second end of the inductor 40b. In this case, the voltage amplitude of the RF signal RFu3 increases. That is, the amplitude of the RF signal RFu3 output from the second end of the inductor 40b increases, and the protection circuit can thus be caused to operate.

Furthermore, in the power amplifier circuit 108, the power-stage differential pair 55 includes the amplifier transistors 52c and 53c and is provided in a stage subsequent to the amplifier transistor 50c. The clamp circuit 81 is provided between the output terminal 52b of the power-stage amplifier 52 and the ground and includes one or more diodes 81a. The clamp circuit 82 is provided between the output terminal 53b of the power-stage amplifier 53 and the ground and includes one or more diodes 82a. The RF signal RFu4 is output from the cathode of the diode 81a and the cathode of the diode 82a.

For example, when the impedance of the load is 50 ohms, the balance between the amplification signals RFp3 and RFm3 output from the amplifier transistors 52c and 53c, respectively, is maintained. However, when the amplitudes of the amplification signals RFp3 and RFm3 are large, voltage amplitude occurs at the cathode of the diode 81a and the cathode of the diode 82a. That is, the amplitudes of the RF signals RFu4 output from the cathode of the diode 81a and the cathode of the diode 82a increase, and the protection circuit can thus be caused to operate. Furthermore, when the impedance of the load is shifted from 50 ohms, the balance between the amplification signals RFp3 and RFm3 is lost, and voltage amplitude occurs at the cathode of the diode 81a and the cathode of the diode 82a. That is, the amplitudes of the RF signals RFu4 output from the cathode of the diode 81a and the cathode of the diode 82a increase, and the protection circuit can thus be caused to operate.

The embodiments described above are intended to facilitate understanding of the present disclosure and are not to be interpreted as limiting the present disclosure. The present disclosure can be modified or improved without necessarily departing from the gist of the disclosure, and the present disclosure encompasses equivalents thereof. That is, design changes appropriately added to each of the embodiments by those skilled in the art are also incorporated in the scope of the present disclosure as long as the design changes include features of the present disclosure. For example, elements included in each of the embodiments and arrangement, materials, conditions, shapes, and sizes of the elements are not limited to those exemplified above and can be modified appropriately. Furthermore, each of the embodiments is an exemplary embodiment. Obviously, configurations described in different embodiments can be partially replaced or combined with one another, and the configurations that are partially replaced or combined are also included in the scope of the present disclosure as long as the configurations include the features of the present disclosure.

What is claimed is:

1. A power amplifier circuit comprising:

a first amplifier configured to operate in accordance with a first voltage supplied from a voltage supply source, to amplify a first signal, and to output an amplification signal;

a bias transistor that has a base or a gate to which a bias control current is supplied, and an emitter or a source configured to supply a bias to the first amplifier through a first resistor; and a protection circuit configured to cause part of the bias control current to flow to ground based on the amplification signal and a second signal based on the first voltage, wherein the protection circuit comprises:

a first transistor that has a base or a gate connected to ground via a first capacitor, and an emitter or a source to which the amplification signal is input through a second capacitor; and a second transistor that has a collector or a drain connected to the base or the gate of the bias transistor, a base or a gate connected to the emitter or the source of the first transistor, and an emitter or a source connected to ground, wherein the second capacitor has a first end connected to a connection node between a second inductor and a third inductor and a second end connected the second transistor, and wherein the emitter or source of the second transistor is connected to ground.

2. The power amplifier circuit according to claim 1, further comprising:

a second amplifier that is in a stage subsequent to the first amplifier; and a bias supply circuit that is configured to supply a bias to the second amplifier based on a current supplied from a control current source, wherein the base or the gate of the first transistor in the protection circuit is connected to the control current source.

3. A power amplifier circuit comprising:

a first amplifier configured to supply power to a load;

a bias transistor that has a base or a gate to which a bias control current is supplied, and an emitter or a source configured to supply a bias to the first amplifier through a first resistor;

a protection circuit configured to cause part of the bias control current to flow to ground based on a third signal based on a change in the load;

a first differential pair that comprises a second amplifier and a third amplifier, and that is in a stage subsequent to the first amplifier;

a first clamp circuit that is between an output terminal of the second amplifier and ground, and that comprises a second diode; and a second clamp circuit that is between an output terminal of the third amplifier and ground, and that comprises a third diode, wherein the third signal is output from a cathode of the second diode and a cathode of the third diode.

4. The power amplifier circuit according to claim 3, wherein the first amplifier is configured to operate in accordance with a first voltage supplied from a voltage supply source, and wherein the protection circuit is configured to cause the part of the bias control current to flow to ground based on a second signal based on the first voltage.

5. The power amplifier circuit according to claim 3, wherein the protection circuit comprises:

a first transistor that has a base or a gate connected to ground via a first capacitor, and an emitter or a source to which the third signal is input through a second capacitor; and a second transistor that has a collector or a drain connected to the base or the gate of the bias transistor, a base or a gate connected to the emitter or the source of the first transistor, and an emitter or a source connected to ground.

6. The power amplifier circuit according to claim 1, wherein the base or the gate of the first transistor in the protection circuit is connected to the voltage supply source.

7. The power amplifier circuit according to claim 5, wherein the first amplifier is configured to operate in accordance with a first voltage supplied from a voltage supply source, and wherein the base or the gate of the first transistor in the protection circuit is connected to the voltage supply source.

8. The power amplifier circuit according to claim 6, further comprising:

a voltage shift circuit that is connected between the base or the gate of the first transistor in the protection circuit and the voltage supply source, and that is configured to shift the first voltage, wherein the voltage shift circuit comprises a first diode.

9. The power amplifier circuit according to claim 7, further comprising:

a voltage shift circuit that is connected between the base or the gate of the first transistor in the protection circuit and the voltage supply source, and that is configured to shift the first voltage, wherein the voltage shift circuit comprises a first diode.

10. The power amplifier circuit according to claim 1, wherein the base or the gate of the first transistor in the protection circuit is connected to the base or the gate of the bias transistor.

11. The power amplifier circuit according to claim 5, wherein the base or the gate of the first transistor in the protection circuit is connected to the base or the gate of the bias transistor.

12. The power amplifier circuit according to claim 10, further comprising:

a second resistor that is connected between the base or the gate of the first transistor in the protection circuit and the base or the gate of the bias transistor.

13. The power amplifier circuit according to claim 11, further comprising:

a second resistor that is connected between the base or the gate of the first transistor in the protection circuit and the base or the gate of the bias transistor.

14. The power amplifier circuit according to claim 3, further comprising:

a fourth amplifier that forms, together with the first amplifier, a second differential pair; and a third balun that is in a stage preceding the second differential pair, wherein the third balun comprises:

a seventh inductor that has a first end connected to an input terminal of the power amplifier circuit, and a second end connected to the ground, an eighth inductor that has a first end connected to an input terminal of the first amplifier, and a second end configured to output the third signal, the eighth inductor being electromagnetically coupled to the seventh inductor, and a ninth inductor that has a first end connected to the second end of the eight inductor, and a second end connected to an input terminal of the fourth amplifier, the ninth inductor being electromagnetically coupled to the seventh inductor.

15. The power amplifier circuit according to claim 5, further comprising:

the second amplifier that is in a stage subsequent to the first amplifier; and a bias supply circuit that is configured to supply a bias to the second amplifier based on a current supplied from a control current source, wherein the base or the gate of the first transistor in the protection circuit is connected to the control current source.

16. The power amplifier circuit according to claim 3, further comprising:

a first balun that is between the first amplifier and the first differential pair, wherein the first balun comprises:

a first inductor that has a first end connected to an output terminal of the first amplifier, and a second end connected to a low-impedance node, a second inductor that has a first end connected to an input terminal of the second amplifier, and a second end configured to output the third signal, the second inductor being electromagnetically coupled to the first inductor, and a third inductor that has a first end connected to the second end of the second inductor, and a second end connected to an input terminal of the third amplifier, the third inductor being electromagnetically coupled to the first inductor.

17. The power amplifier circuit according to claim 3, further comprising:

a second balun that is in a stage subsequent to the first differential pair, wherein the second balun comprises:

a fourth inductor that has a first end connected to an output terminal of the power amplifier circuit, and a second end connected to ground, a fifth inductor that has a first end connected to the output terminal of the second amplifier, and a second end configured to output the third signal, the fifth inductor being electromagnetically coupled to the fourth inductor, and a sixth inductor that has a first end connected to the second end of the fifth inductor, and a second end connected to the output terminal of the third amplifier, the sixth inductor being electromagnetically coupled to the fourth inductor.

* * * * *